United States Patent
Yamazaki et al.

(10) Patent No.: US 8,354,786 B2
(45) Date of Patent: Jan. 15, 2013

(54) LIGHT-EMITTING DEVICE

(75) Inventors: Shunpei Yamazaki, Tokyo (JP); Satoshi Seo, Kanagawa (JP); Mayumi Mizukami, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 264 days.

(21) Appl. No.: 12/265,212

(22) Filed: Nov. 5, 2008

(65) Prior Publication Data

US 2009/0058285 A1 Mar. 5, 2009

Related U.S. Application Data

(63) Continuation of application No. 10/062,005, filed on Jan. 31, 2002, now abandoned.

(30) Foreign Application Priority Data

Feb. 1, 2001 (JP) .................................. 2001-26184

(51) Int. Cl.
H01L 51/52 (2006.01)

(52) U.S. Cl. ...... 313/504; 313/506; 313/509; 315/169.3

(58) Field of Classification Search ................... 313/504, 313/506, 509; 315/169.3
See application file for complete search history.

(56) References Cited

U.S. PATENT DOCUMENTS

| | | | |
|---|---|---|---|
| 3,654,525 A | 4/1972 | Maricle | |
| 4,511,429 A * | 4/1985 | Mizutani et al. ................ 216/77 |
| 4,511,599 A | 4/1985 | Rustomji | |
| 4,810,619 A * | 3/1989 | Pampalone et al. ........... 430/313 |
| 5,017,863 A | 5/1991 | Mellitz | |
| 5,039,657 A | 8/1991 | Goldman | |
| 5,118,986 A * | 6/1992 | Ohnuma et al. .............. 313/504 |
| 5,170,990 A | 12/1992 | Kamiya | |
| 5,256,945 A | 10/1993 | Imai | |
| 5,271,089 A | 12/1993 | Ozawa | |
| 5,281,489 A | 1/1994 | Mori | |
| 5,486,406 A | 1/1996 | Shi | |
| 5,513,499 A | 5/1996 | deRijke | |
| 5,585,137 A | 12/1996 | Nakamura | |
| 5,640,067 A | 6/1997 | Yamauchi | |
| 5,701,055 A | 12/1997 | Nagayama | |
| 5,707,883 A * | 1/1998 | Tabara ......................... 438/297 |

(Continued)

FOREIGN PATENT DOCUMENTS

EP 999595 A2 * 5/2000

(Continued)

OTHER PUBLICATIONS

Translation of JP 04537694.*

(Continued)

*Primary Examiner* — Nimeshkumar Patel
*Assistant Examiner* — Steven Horikoshi
(74) *Attorney, Agent, or Firm* — Fish & Richardson P.C.

(57) ABSTRACT

A light-emitting device includes a transistor over a substrate and an insulating film over the transistor. The light-emitting device further includes a wiring over the insulating film and a light-emitting element. The insulating film includes a first opening and a second opening, and the wiring is electrically connected to the transistor through the first opening. The light-emitting element is provided in the second opening, and includes a first electrode, a second electrode, and an organic compound layer provided between the first electrode and the second electrode.

15 Claims, 17 Drawing Sheets

U.S. PATENT DOCUMENTS

| | | |
|---|---|---|
| 5,719,467 A | 2/1998 | Antoniadis |
| 5,725,664 A | 3/1998 | Nanbu |
| 5,817,366 A | 10/1998 | Arai |
| 5,817,431 A | 10/1998 | Shi |
| 5,834,327 A | 11/1998 | Yamazaki |
| 5,849,403 A | 12/1998 | Aoki |
| 5,853,905 A | 12/1998 | So |
| 5,858,563 A | 1/1999 | Sano |
| 5,897,328 A | 4/1999 | Yamauchi |
| 5,925,472 A | 7/1999 | Hu |
| 5,925,980 A * | 7/1999 | So et al. .................. 313/504 |
| 5,955,836 A | 9/1999 | Boerner |
| 5,989,737 A | 11/1999 | Xie |
| 6,001,413 A | 12/1999 | Matsuura |
| 6,030,715 A | 2/2000 | Thompson |
| 6,066,357 A | 5/2000 | Tang |
| 6,097,147 A | 8/2000 | Baldo |
| 6,117,529 A * | 9/2000 | Leising et al. ............ 428/209 |
| 6,121,727 A | 9/2000 | Kanai |
| 6,130,001 A | 10/2000 | Shi |
| 6,132,280 A | 10/2000 | Tanabe |
| 6,132,647 A | 10/2000 | Katayama |
| 6,150,042 A | 11/2000 | Tamano |
| 6,150,043 A | 11/2000 | Thompson |
| 6,160,272 A | 12/2000 | Arai |
| 6,214,631 B1 | 4/2001 | Burrows |
| 6,215,462 B1 | 4/2001 | Yamada |
| 6,228,228 B1 | 5/2001 | Singh |
| 6,237,529 B1 | 5/2001 | Spahn |
| 6,246,179 B1* | 6/2001 | Yamada ............... 315/169.3 |
| 6,275,649 B1 | 8/2001 | Nagashima |
| 6,275,949 B1 | 8/2001 | Watanabe |
| 6,284,050 B1 | 9/2001 | Shi |
| 6,285,039 B1 | 9/2001 | Kobori |
| 6,303,238 B1 | 10/2001 | Thompson |
| 6,310,360 B1 | 10/2001 | Forrest |
| 6,326,091 B1 | 12/2001 | Schoo |
| 6,366,017 B1 | 4/2002 | Antoniadis |
| 6,368,730 B1 | 4/2002 | Kishimoto |
| 6,372,154 B1 | 4/2002 | Li |
| 6,392,250 B1 | 5/2002 | Aziz |
| 6,392,339 B1 | 5/2002 | Aziz |
| 6,396,209 B1 | 5/2002 | Kido |
| 6,413,656 B1 | 7/2002 | Thompson |
| 6,432,255 B1 | 8/2002 | Sun |
| 6,448,580 B1 | 9/2002 | Arai |
| 6,458,475 B1 | 10/2002 | Adachi |
| 6,468,676 B1 | 10/2002 | Ueda |
| 6,495,198 B2 | 12/2002 | Peng |
| 6,517,996 B1 | 2/2003 | Chao |
| 6,524,728 B1 | 2/2003 | Kijima |
| 6,528,824 B2 | 3/2003 | Yamagata |
| 6,534,202 B2 | 3/2003 | Sato |
| 6,541,909 B1 | 4/2003 | Motomatsu |
| 6,558,817 B1 | 5/2003 | Ueda |
| 6,559,065 B2 | 5/2003 | Kawashima |
| 6,566,807 B1 | 5/2003 | Fujita |
| 6,592,933 B2 | 7/2003 | Himeshima |
| 6,603,140 B2 | 8/2003 | Kobori |
| 6,614,175 B2 | 9/2003 | Aziz |
| 6,682,782 B2 | 1/2004 | Jung |
| 6,734,463 B2 | 5/2004 | Ishikawa |
| 6,759,144 B2 | 7/2004 | Toguchi |
| 6,774,574 B1 | 8/2004 | Koyama |
| 6,777,887 B2 | 8/2004 | Koyama |
| 6,803,720 B2 | 10/2004 | Kwong |
| 6,831,406 B1 | 12/2004 | Fukuyama |
| 6,853,083 B1 | 2/2005 | Yamauchi |
| 6,965,124 B2 | 11/2005 | Yamagata |
| 6,992,435 B2 | 1/2006 | Yamauchi |
| 7,095,046 B2 | 8/2006 | Ishikawa |
| 7,112,462 B2 | 9/2006 | Arai |
| 7,173,370 B2 | 2/2007 | Seo |
| 7,196,360 B2 | 3/2007 | Seo |
| 7,214,555 B2 | 5/2007 | Yamazaki |
| 7,271,858 B2 | 9/2007 | Yamazaki et al. |
| 7,332,857 B2 | 2/2008 | Seo |
| 7,342,355 B2 | 3/2008 | Seo |
| 7,393,792 B2 | 7/2008 | Yamagata |
| 7,399,991 B2 | 7/2008 | Seo |
| 7,432,116 B2 | 10/2008 | Yamazaki |
| 2001/0003601 A1 | 6/2001 | Ueda |
| 2001/0026123 A1* | 10/2001 | Yoneda .................. 313/504 |
| 2001/0051207 A1 | 12/2001 | Yamagata |
| 2002/0018912 A1 | 2/2002 | Jung |
| 2002/0038867 A1 | 4/2002 | Kobori |
| 2002/0074935 A1 | 6/2002 | Kwong |
| 2002/0081767 A1 | 6/2002 | Kawashima |
| 2002/0086180 A1 | 7/2002 | Seo |
| 2002/0093283 A1 | 7/2002 | Seo |
| 2002/0121860 A1 | 9/2002 | Seo |
| 2002/0139303 A1 | 10/2002 | Yamazaki |
| 2002/0145380 A1 | 10/2002 | Aziz |
| 2003/0010288 A1 | 1/2003 | Yamazaki |
| 2003/0118950 A1 | 6/2003 | Chao |
| 2003/0134145 A1 | 7/2003 | Toguchi |
| 2003/0143430 A1 | 7/2003 | Kawamura |
| 2004/0207331 A1 | 10/2004 | Koyama |
| 2006/0087222 A1 | 4/2006 | Yamauchi |
| 2008/0188022 A1 | 8/2008 | Yamazaki |

FOREIGN PATENT DOCUMENTS

| | | |
|---|---|---|
| EP | 1 011 155 | 6/2000 |
| EP | 1006587 A2 * | 6/2000 |
| EP | 1 017 118 | 7/2000 |
| EP | 1 029 909 | 8/2000 |
| EP | 1056141 A2 * | 11/2000 |
| EP | 1 063 630 | 12/2000 |
| EP | 1 065 737 | 1/2001 |
| EP | 1 220 340 | 7/2002 |
| JP | 03-114197 | 5/1991 |
| JP | 04-357694 | 12/1992 |
| JP | 04357694 A * | 12/1992 |
| JP | 08-111285 | 4/1996 |
| JP | 10-233288 | 9/1998 |
| JP | 2000-208262 | 7/2000 |
| JP | 2000-313952 | 11/2000 |
| JP | 2000-328229 | 11/2000 |
| JP | 2001-005426 | 1/2001 |
| JP | 2001-023776 | 1/2001 |
| JP | 2001-052870 | 2/2001 |
| JP | 2002-151259 | 5/2002 |
| TW | 243470 | 3/1995 |
| TW | 366598 | 8/1999 |
| TW | 451601 | 8/2001 |
| WO | WO 98-08360 | 2/1998 |
| WO | WO 02-47457 | 6/2002 |

OTHER PUBLICATIONS

Translation of JP 0437694, translated on Nov. 2006, original document published Dec. 1992.*

Australian Patent Office Search Report SG 200200037-0, dated Oct. 7, 2003.

Australian Patent Office Search Report SG200200365-5, dated Nov. 11, 2003, 11 pages.

Australian Patent Office Search Report SG 200202969-2, dated Apr. 27, 2004.

Adachi et al. "Electroluminescence in Organic Films with Three-Layer Structure." Japanese Journal of Applied Physics; vol. 27, No. 2, pp. L269-L271 (1988).

J. Kido et al. "Multilayer white light-emitting organic electroluminescent device." Science 267: 1995. p. 1332-1334.

Kijima et al. "A Blue Organic Light Emitting Diode." Japanese Journal of Applied Physics vol. 38, pp. 5274-5277 (1999).

Takeshi Nishi et al., "High Efficiency TFT-OLED Display with Iridium-Complex As Triplet Emissive Center", *Proceedings of the 10th International Workshop on Inorganic and Organic Electroluminescence*, pp. 353-356, Dec. 4-7, 2000.

D.F. O'Brien et al. "Improved energy transfer in electrophophorescent devices." Applied Physics Letters, vol. 74, No. 3, pp. 442-444 (1999).

C.W. Tang et al. "Electroluminescence of doped organic thin films." J. Appl. Phys. 65(9): 1989. p. 3610-3616.

Tang et al. "Organic electroluminescent diodes." Applied Physics Letters, vol. 51, No. 12, pp. 913-915 (1987).

Tsutsui. "Bulletin of organic molecular/bioelectronics." Subcommittee of Society of Applied Physics, vol. 11, No. 1, p. 8 (2000).

Tsutsui et al. "High Quantum Efficiency in Organic Light-Emitting Devices with Iridium-Complex as Triplet Emissive Center." Japanese Journal of Applied Physics, vol. 38, Part 12B, Dec. 15, 1999.

T. Tsutsui et al.; "New Aspect of Research and Development of Organic EL"; M&BE Seminar, Bulletin of Organic Molecular/Bioelectronics Subcommittee, Society of Applied Physics, 11(1); 2000; pp. 3-12 (plus Full English Translation, pp. 1-18).

T. Tsutsui et al.; "The operation mechanism and the light emission efficiency of the organic EL element." Text of the Third Lecture Meeting, Bulletin of Organic Molecular/Bioelectronics Subcommittee, Society of Applied Physics, p. 31-37.

S.A. Van Slyke et al. "Organic electroluminescent devices with improved stability." Applied Physics Letters, vol. 69, No. 15, pp. 2160-2162.

Wakimoto et al. "Organic EL Cells Using Alkaline Metal Compounds as Electron Injection Materials." IEEE transactions on electron devices, vol. 44, No. 8, pp. 1245-1248.

Tsutsui et al. "High Quantum Efficiency in Organic Light-Emitting Devices with Iridium-Complex as Triplet Emissive Center." Japanese Journal of Applied Physics, vol. 38, Part 12B, L1502-L1504, Dec. 15, 1999.

* cited by examiner

Fig. 1A Prior
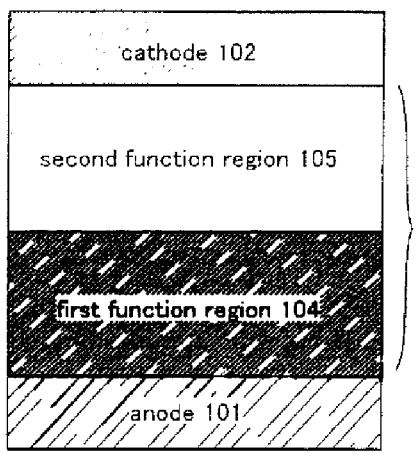
Fig. 1B
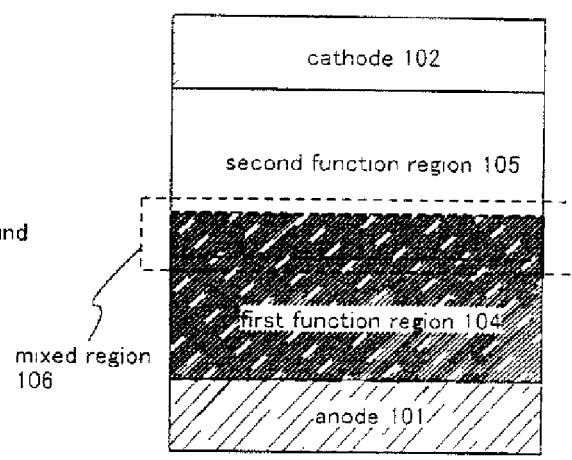
Fig. 1C Prior
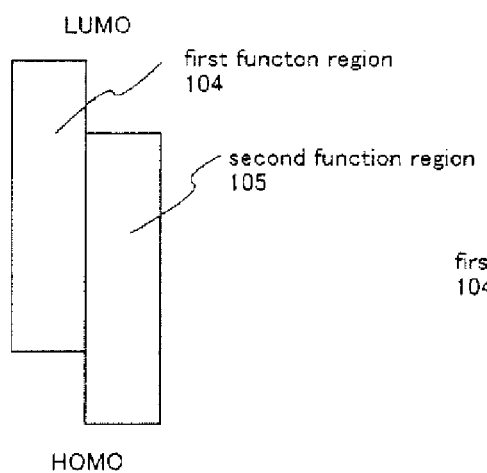
Fig. 1D
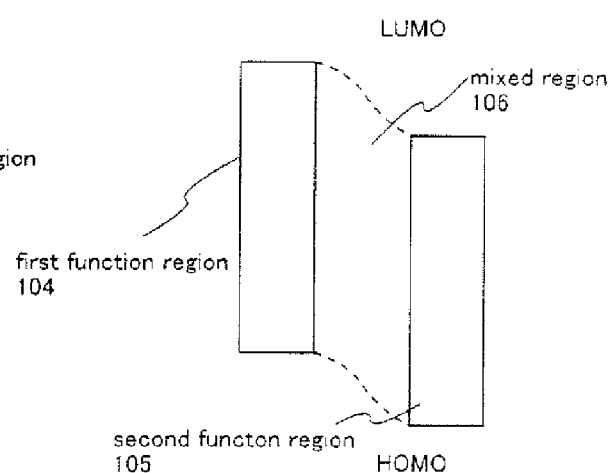

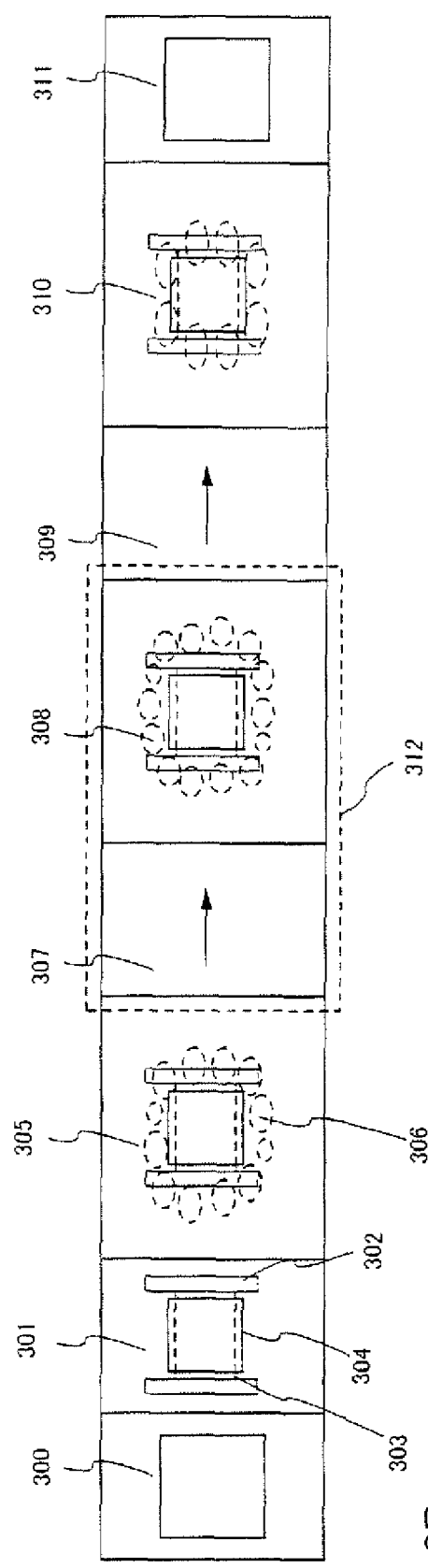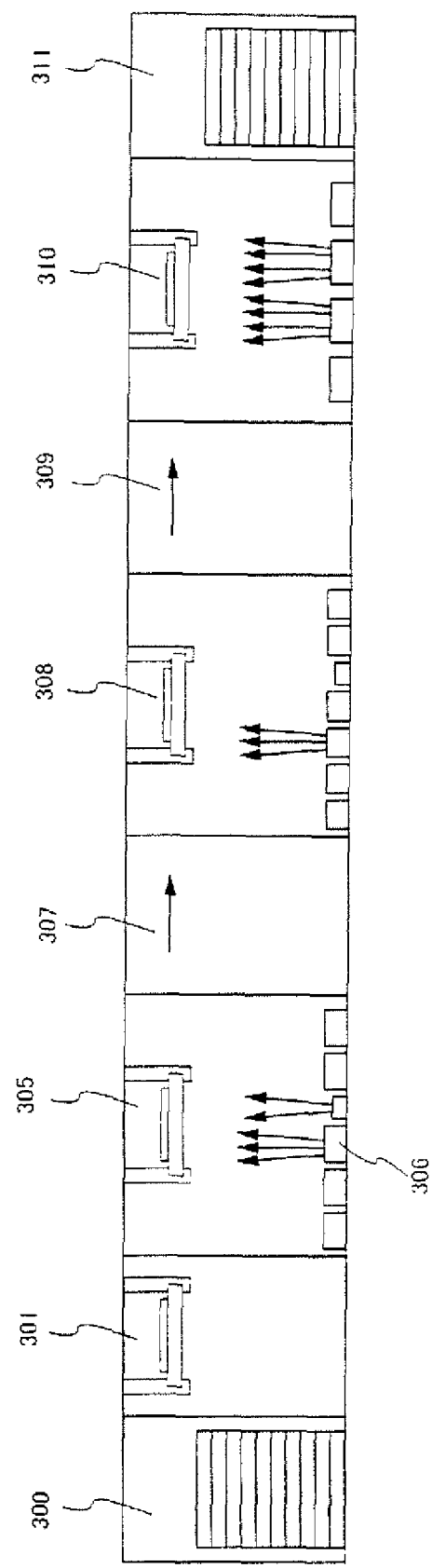
Fig. 3A
Fig. 3B

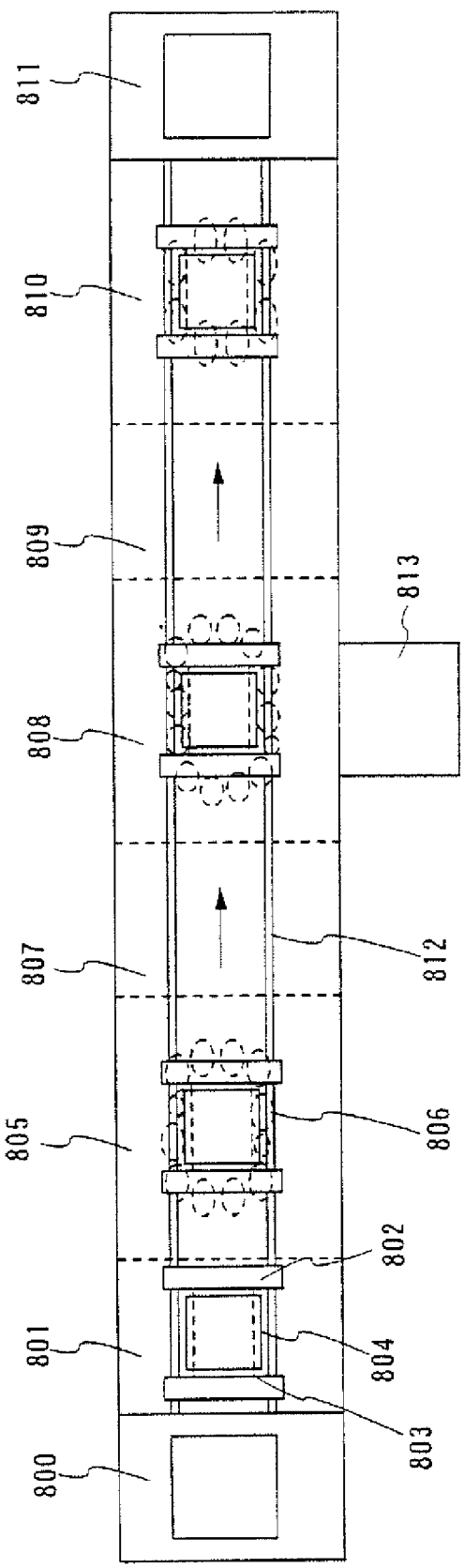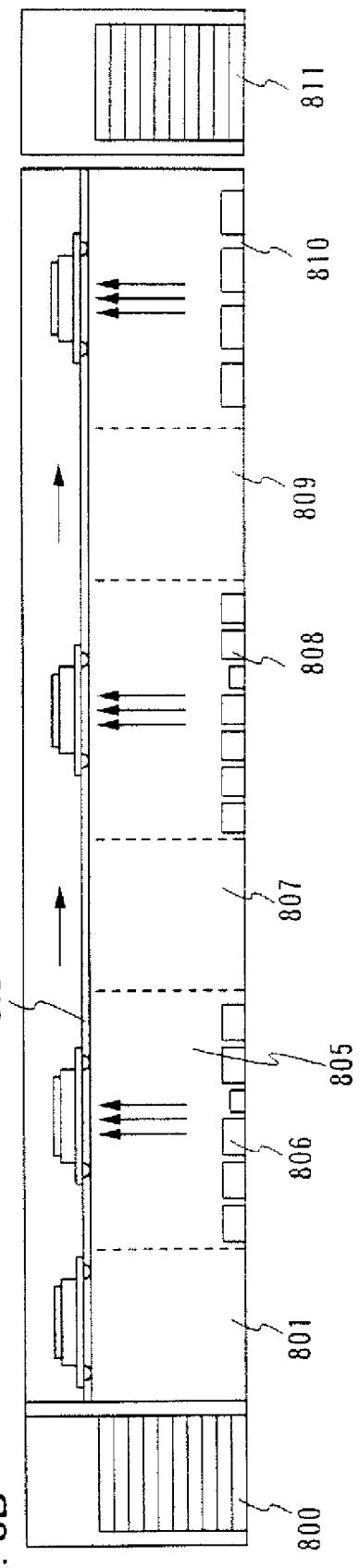

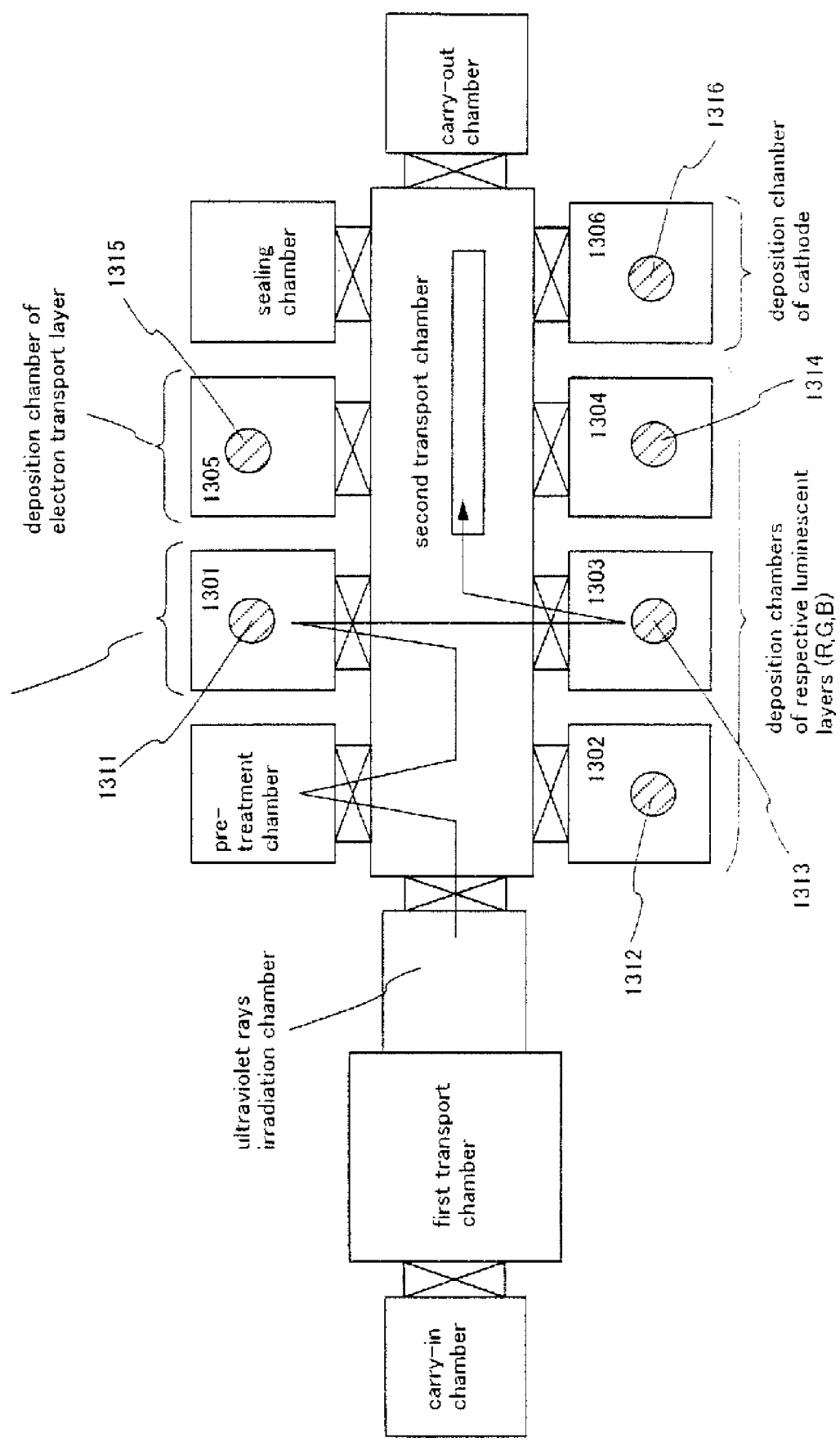
Fig. 13 Prior

LIGHT-EMITTING DEVICE

CROSS-REFERENCE TO RELATED APPLICATIONS

This application is a continuation of U.S. application Ser. No. 10/062,005, filed Jan. 31, 2002, now pending, which claims the benefit of a foreign priority application filed in Japan as Serial No. 2001-26184 on Feb. 1, 2001, both of which are incorporated by reference.

BACKGROUND OF THE INVENTION

1. Field of the Invention

The invention relates to a luminescent device using an organic luminescent element having an anode, a cathode, and a film (referred below to as "organic compound layer"), which includes an organic compound adapted to effect luminescence upon application of an electric field. Specifically, the present invention relates to a manufacturing of a luminescent element which requires a lower drive voltage and has a longer life than luminescent devices of the related art. Further, the luminescent device described in the specification of the present application indicates an image display device or a luminescent device, which use an organic luminescent element as luminescent element. Also, the luminescent device includes all of modules, in which a connector, for example, an anisotropic electroconductive film (FPC: Flexible printed circuit) or a TAB (Tape Automated Bonding) tape or a TCP (Tape Carrier Package) is mounted to an organic luminescent element, modules, in which a printed-circuit board is provided on a TAB tape or a tip end of a TCP, or modules, in which an IC (integrated circuit) is directly mounted on an organic luminescent element in the COG (Chip On Glass) system.

2. Description of the Related Art

An organic luminescent element is one adapted to effect luminescence upon application of an electric field. A mechanism for luminescence has been said to reside in that an organic compound layer is interposed between electrodes, upon application of voltage thereto electrons filled from a cathode and holes filled from an anode recombine together at a center of luminescence in the organic compound layer to form molecule excitons, and the molecule excitons discharge energy to produce luminescence when returned to the base state.

In addition, kinds of molecule excitons formed by the organic compound can include a singlet excited state and a triplet excited state, while the specification of the present invention contains the case where either of the excited states contributes to luminescence.

In such organic luminescent element, an organic compound layer is normally formed in a thin film below 1 μm. Also, since the organic luminescent element is a self-luminescent type one, in which the organic compound layer itself emits light, a backlight used in a conventional liquid crystal display is not necessary. Accordingly, the organic luminescent element can be very advantageously formed to be thin and lightweight.

Also, with, for example, an organic compound layer of about 100 to 200 nm in thickness, a time period having elapsed from filling of a carrier to recombination thereof is in the order of several tens of nanosecond taking account of the extent of movement of the carrier in the organic compound layer, and luminescence is achieved in the order of less than one micro second even when the procedure from the recombination of the carrier to luminescence is included. Accordingly, one of the features is that the speed of response is very large.

Further, since the organic luminescent element is a carrier-filling type luminescent element, it can be driven by DC voltage, and is hard to generate noise. With respect to drive voltage, an adequate luminance of 100 $cd/m^2$ is achieved at 5.5 V by first making the thickness of an organic compound layer a uniform, super-thin film of around 100 nm, selecting an electrode material, which reduces a carrier filling barrier relative to the organic compound layer, and further introducing a single hetero structure (double structure) (Literature 1: C. W. Tang and S. A. VanSlyke, "Organic electroluminescent diodes", Applied Physics Letters, vol. 51, No. 12, 913-915 (1987)).

Owing to such performances as thin and lightweight, high-speed responsibility. DC low voltage drive, and the like, organic luminescent elements have been given attention as next-generation flat panel display elements. Also, since organic luminescent elements are of self-luminescent type and large in angle of visibility, they are comparatively favorable in visibility and believed to be effective as elements used for displays in portable equipments.

Hereupon, in the constitution of an organic luminescent element described in Literature 1, a carrier filling barrier is made small by using as a cathode a relatively stable Mg:Ag alloy of low work function to enhance an electron injecting quality. This makes it possible to fill a large amount of carrier into the organic compound layer.

Further, the recombination efficiency of the carrier is improved by leaps and bounds by application of a single hetero structure, in which a hole transporting layer composed of a diamine compound and an electron transporting luminescent layer composed of tris(8-quinolinolato)aluminium (hereinafter written as "$Alq_3$") are laminated as an organic compound layer, which is explained below.

In the case of, for example, an organic luminescent element having only a single $Alq_3$ layer, a major part of electrons filled from a cathode reaches an anode without recombining with holes, making the luminescent efficiency very low, since $Alq_3$, is of electron transporting quality. That is, in order to have the single-layered organic luminescent element efficiently emitting light (or driving at low voltage), it is necessary to use a material (referred below to as "bipolar material") capable of carrying both electrons and holes in well-balanced manner, and $Alq_3$ does not meet such requirement.

However, application of the single hetero structure described in Literature 1 causes electrons filled from a cathode to be blocked by an interface between the hole transporting layer and the electron transporting luminescent layer to be enclosed in the electron transporting luminescent layer. Accordingly, the carrier is efficiently recombined in the electron transporting luminescent layer to provide for efficient luminescence.

When the concept of such carrier blocking function is developed, it becomes possible to control a carrier recombining region. As an example, there is a report, according to which success is achieved in enclosing holes in a hole transporting layer and making the hole transporting layer luminescent by inserting a layer (hole blocking layer), which is capable of blocking holes, between the hole transporting layer and an electron transporting layer (Literature 2: Yasunori KIJIMA. Nobutoshi ASAI and Shin-ichiro TAMURA, "A Blue Organic Luminescent Diode". Japanese Journal of Applied Physics, Vol. 38, 5274-5277 (1999)).

Also, it can be said that the organic luminescent element described in Literature 1 is based on, so to speak, that thought of functional separation, according to which carrying of holes is performed by the hole transporting layer and carrying and luminescence of electrons are performed by the electron transporting luminescent layer. Such concept of functional separation has further grown to a concept of double heterostructure (three-layered structure), according to which a luminescent layer is inserted between the hole transporting layer and the electron transporting layer (Literature 3: Chihaya ADACHI, Shizuo TOKITO, Tetsuo TSUTSUI and Shogo SAITO, "Electroluminescence in Organic Films with Three-Layered Structure", Japanese Journal of Applied Physics. Vol. 27. No. 2. L269-L271 (1988)).

Such functional separation has an advantage in that the functional separation makes it unnecessary for a kind of organic material to have a variety of functions (luminescence, carrier carrying quality, filling quality of carrier from electrode, and so on) at a time, which provides a wide freedom in molecular design or the like (for example, it is unnecessary to unreasonably search for bipolar materials). That is, a high luminous efficiency can be easily attained by combining materials having a good luminous quality and a carrier carrying quality, respectively.

Owing to these advantages, the concept of the laminated structure (carrier blocking function or functional separation) itself described in Literature 1 has been widely utilized till now.

It is also noted that in the fabrication of these luminescent elements, in particular in mass-production processes, a deposition apparatus of the in-line type (multi-chamber scheme) is typically employed in order to prevent contamination of respective materials upon lamination of a hole transport material and a luminescent material, and an electron transport material or the like by vacuum evaporation. Additionally an upper plan view of such deposition apparatus is shown in FIG. 13.

In the deposition apparatus shown in FIG. 13, it is possible to perform a vacuum evaporation of a cathode and a three-layer lamination structure (double-heterostructure) of a hole transport layer and a luminescent layer, and an electron transport layer on a substrate having an anode (such as ITO or else), and to perform a sealing processing thereof.

Firstly, transfer a substrate with the anode into a carry-in chamber. The substrate is transferred through a first transfer chamber toward an ultraviolet ray irradiation chamber, and is then subjected to cleaning treatment on the surface of such anode, by irradiation of ultraviolet rays in a vacuum environment. Note here that in case the anode is made of oxides such as ITO, the anode is oxidized here in a pretreatment chamber.

Next, a hole transport layer is formed in a vapor evaporation chamber 1301 while forming luminescent layers (in FIG. 13, three colors of red, green and blue) in vacuum evaporation chambers 1302 to 1304, and forming an electron transport layer in a vacuum evaporation chamber 1305, and then forming a cathode in a vacuum evaporation chamber 1316. Lastly, sealing processing is carried out in a sealing chamber, thereby obtaining a luminescent element from a carry-out chamber.

One feature unique to the deposition apparatus of the inline type is that vacuum evaporation of respective layers are being performed in different vacuum evaporation chambers 1301 to 1305 respectively. Accordingly, each of the vacuum evaporation chambers 1301 to 1305 may ordinarily be provided with a single evaporation source (note however that in the vacuum evaporation chambers 1302 to 1304, two evaporation sources will possibly be required from time to time for formation of a co-vacuum evaporation layer in the case of fabrication of a luminescent layer by doping pigment thereinto). To be brief, a specific apparatus arrangement is employed, in which materials of respective layers are hardly mixed into each other.

However, being a junction between substances of different kinds (in particular, a junction between insulating materials), the laminated structure described above will necessarily produce an energy barrier at an interface the substances. Since the presence of an energy barrier inhibits movements of a carrier at the interface, the two following problems are caused.

One of the problems is that it results in a barrier leading to further reduction of drive voltage. Actually, it has been reported with respect to existing organic luminescent elements that an element of a single-layered structure making use of a conjugate polymer is excellent in terms of drive voltage and holds top data (comparison in luminescence from the singlet excited state) in power efficiency (unit "lm/W") (Literature 4: Tetsuo Tsutsui "bulletin of organic molecular/bioelectronics" subcommittee of Society of Applied Physics, Vol. 11, No. 1, P. 8 (2000)).

In addition, the conjugate polymer described in Literature 4 is a bipolar material, and can attain a level equivalent to that of the laminated structure with respect to the recombination efficiency of a carrier. Accordingly, it demonstrates that a single layer structure having less interfaces is actually low in drive voltage provided that a method making use of a bipolar material can make an equivalent recombination efficiency of a carrier without the use of any laminated structure.

For example, there is a method, in which a material for mitigating an energy barrier is inserted at an interface between an electrode and an organic compound layer to enhance a carrier filling quality to reduce drive voltage (Literature 5: Takeo Wakimoto. Yoshinori Fukuda. Kenichi Nagayama. Akira Yokoi. Hitoshi Nakada, and Masami Tsuchida, "Organic EL Cells Using Alkaline Metal Compounds as Electron Injection Materials", IEE TRANSACTIONS ON ELECTRON DEVICES. VOL. 44. NO. 8, 1245-1248 (1977)). In Literature 5, the use of $Li_2O$ as an electron injecting layer has been successful in reduction of drive voltage.

However, the carrier transfer between organic materials (e.g. between the hole transport layer and luminescent layer; the interface will hereinafter be called "organic interface") remains as an unsettled issue and is considered to be an important point in catching up with the low drive voltage provided by the single-lave red structure.

Further, the other problem caused by an energy barrier is believed to be an influence on the service life of organic luminescent elements. That is, movements of a carrier are impeded, and brilliance is lowered due to build-up of charges.

While any definite theory has not been established with respect to such mechanism of deterioration, there is a report that lowering of brilliance can be suppressed by inserting a hole injecting layer between an anode and a hole transporting layer and employing not DC driving but AC driving of rectangular wave (Literature 6; S. A. VanSlyke, C. H. Chen, and C. W. Tang, "Organic electroluminescent devices with improved stability", Applied Physics Letters, Vol. 69, No. 15, 2160-2162 (1996)). This can be said to present an experimental evidence that lowering of brilliance can be suppressed by eliminating accumulation of charges due to insertion of a hole injecting layer and AC driving.

It can be said from the above that on one hand the laminated structure has an advantage in enabling easily enhancing the recombination efficiency of a carrier and enlarging a range of material selection in terms of functional separation and on the other hand formation of many organic interfaces impedes movements of a carrier and has an influence on lowering of drive voltage and brilliance.

Additionally in the prior art deposition apparatus, lamination of the hole transport material and luminescent layer material, electron transport material or else is done in separate chambers provided with its own evaporation source in order to prevent contamination of respective materials. However, such apparatus is encountered with problems that organic interfaces are clearly separated and when a substrate is driven to move between chambers, impurities such as water and oxygen can be mixed into the organic interface, in the case of forming the above-noted multilayer structure.

SUMMARY OF THE INVENTION

Hence, the present invention provides deposition apparatuses based on concepts different from the prior used multilayer structures for fabricating an element having functions of a variety of kinds of materials in a similar manner to the function separation of multilayer structures while at the same time relaxing energy barriers present in organic compound layers to thereby enhance the mobility of electrical carriers. Another object of the invention is to provide deposition method employing these deposition apparatuses.

Regarding the energy barrier relaxation in multilayer structures, it is remarkably seen in the technique for insertion of a carrier injection layer as found in the Document 5. In other words, at the interface of a multilayer structure having a large energy barrier, insertion of a material for relaxing such energy barrier makes it possible to design the energy barrier into the form of a stair step-like shape.

With such an arrangement, it is possible to increase the injectability of electrical carriers from an electrode and to reduce a drive voltage to a certain degree. However, a problem faced with this approach is that an increase in requisite number of layers would result in an increase in organic interface number. As suggested from Document 4, this is considered to be a cause for the fact that single-layer structures are superior to multilayer structures in holding of the top-class data as to the drive voltage and power efficiency.

Adversely, overcoming this point makes it possible to catch up the drive voltage/power efficiency of single-layer structure while at the same time maintaining the merits of multilayer structures (enabling combination of a variety of materials while avoiding the need for any complicated molecular design).

Then in the present invention, in the case of forming an organic compound layer 103 consisting a plurality of function regions between an anode 101 and a cathode 102 in a luminescent element as shown in FIGS. 1A and 1B, not the prior art multilayer structure with the presence of distinct interfaces (FIG. 1A) but a structure (FIG. 1B) having a mixed region 106 comprising both a material constituting a first function region 104 and a material constituting a second function region 105 between the first function region 104 and the second function region 105 is formed.

It is considered that applying the structure shown in FIG. 1B causes any energy barrier existing between function regions to decrease when compared to the prior art structure shown in FIG. 1A, resulting in an improvement in carrier injectability. Practically, while an energy band diagram in the structure of FIG. 1A is as shown in FIG. 1C, in the case of forming a structure with a mixed region between function regions as shown in FIG. 1B, its energy band diagram becomes as shown in FIG. 1D. To be brief, the energy barrier between function regions is relaxed by formation of such mixed region therebetween. Thus, it becomes possible to prevent drive voltage drop-down and luminance reduction.

From the foregoing, with deposition apparatus of the present invention, in the manufacture of a luminescent element which at least includes a region (first function region) which a first organic compound can express function and a region (second function region) which a second organic compound different from the substance consisting the first function region can express function and also of a luminescent device having the luminescent element, a feature unique thereto is that a mixed region comprised of the organic compound constituting the first function region and organic compound constituting the second function region is fabricated between the first function region and the second function region.

It should be noted that the first organic compound and second organic compound are different in nature from each other while each having its nature as selected from the group consisting of hole injectability for receipt of holes from the anode, hole transportability with hole mobility greater than electron mobility, electron transportability with electron mobility greater than hole mobility, electron injectability for receipt of electrons from the cathode, blocking ability for enabling preclusion of movement of either holes or electrons, and luminescent ability exhibiting luminescence.

Also note that the organic compound with high hole injectability is preferably made of phthalocyanine-based compound; the organic compound with high hole transportability may be aromatic diamine compound; and, the organic compound with high electron transportability may be a metal complex that contains therein quinoline skeleton, metal complex containing benzoquinoline skeleton or oxadiazole derivative or triazole derivative or phenanthroline derivative. Furthermore, the organic compound exhibiting luminescence may preferably be a metal complex containing therein quinoline skeleton with stabilized light emission, metal complex containing benzooxazole skeleton, or metal complex containing benzothiazole skeleton.

Some combinations of the above-stated first function region and the second function region are shown in Table 1 presented below. Combinations A to E may be employable solely (e.g. only "A") or alternatively some of them are introduced together in a composite fashion (e.g. both "A" and "B").

TABLE 1

| Combination | 1st Function Region | 2nd Function Region |
|---|---|---|
| A | Hole Injectability | Hole Transportability |
| B | Electron Injectability | Electron Transportability |
| C | Hole Transportability | Luminescent ability |
| D | Electron Transportability | Luminescent ability |
| E | Electron Transportability | Blocking Ability |

Additionally in the case of introduction with composite use of the combinations C and D (that is, when introducing a mixed region at the both interfaces of a function region with luminescent ability), by preventing diffusion of molecular excitons formed in the luminescent region, it is possible to further increase the luminescent efficiency. Thus it will be preferable that the excitation energy of such luminescent region is lower than the excitation energy of the hole region and the excitation energy of electron transport region. In this case, since luminescent material poor in carrier transportability is also utilizable as the luminescent region, there is an advantage that the range of selecting material expands accordingly. Note here that the term "excitation energy" used in this specification is to be understood to mean an energy difference between the highest occupied molecular orbital (HOMO) and the lowest unoccupied molecular orbital (LUMO).

More preferably, it is designed so that the luminescent region is comprised of both host material and luminescent material (dopant) low in excitation energy than the host material and designed such that the excitation energy of such dopant is lower than the excitation energy of hole transport region and the excitation energy of electron transport layer. With such an arrangement, it is possible to permit the dopant to produce light efficiently while at the same time preventing diffusion of the dopant's molecular excitons. In addition, if the dopant is made of certain material of the carrier trap type then it is also possible to increase the recombination efficiency of carriers.

Hereupon, in view of the luminescent efficiency, organic luminescent elements capable of converting energy (referred below to as "triplet excited energy"), which is discharged when returned to a base state from a triplet excited state, into luminance, have been successively presented, and notice has been taken of their luminous efficiency (Literature 7: D. F. O'Brien, M. A. Baldo, M. E. Thompson and S. R. Forrest. "Improved energy transfer in electrophosphorescent devices", Applied Physics Letters, Vol. 74, No. 3, 442-444 (1999)), (Literature 8: Tetsuo TSUTSUI, Moon-Jae YANG, Masayuki YAHIRO, Kenji NAKAMURA, Teruichi WATANABE. Taishi TSUJI. Yoshinori FUKUDA, Takeo WAKIMOTO and Satoshi MIYAGUCHI. "High Quantum Efficiency in Organic Luminescent devices with Iridium-Complex as a Triplet Emissive Center". Japanese Journal of Applied Physics, Vol. 38, L1502-L1504 (1999)).

A metal complex, of which central metal is platinum, is used in Literature 7, and a metal complex, of which central metal is iridium, is used in Literature 8. These organic luminescent elements capable of converting triplet excited energy into luminance (referred below to as "triplet luminescent diode") can attain higher intensity luminance and higher luminous efficiency than in the related art.

However, Literature 8 has presented an example, in which half-life of luminance is about 170 hours in the case where the initial luminance is set to 500 cd/m$^2$, thus causing a problem in service life of an element. Hereupon, application of the invention to triplet light emitting diodes can provide a highly functional luminescent element, which is long in service life in addition to high intensity luminance and high luminous efficiency based on luminance from a triplet excited state.

Consequently the case of adding a material capable of converting the triplet excitation energy to light emission into the mixed region as a dopant will also be included in the present invention. Additionally in the formation of such mixed region, it is permissible that the mixed region has a concentration gradient.

With the deposition apparatus of the present invention, the feature lies in that a plurality of function regions are deposited within the same deposition chamber having a plurality of evaporation sources to thereby form a luminescent element having the mixed region stated supra.

An explanation will now be given of a deposition chamber 210 as used in the deposition apparatus of this invention with reference to FIG. 2A. As shown in FIG. 2A, a metal mask 202 being fixed to a holder 201 is furnished beneath a substrate 200, with an evaporation source 203a to 203c being provided further beneath it. Evaporation sources 203 (203a to 203c) comprises organic compounds 204 (204a to 204c) for fabrication of organic compound layer, material chambers 205 (205a to 205c) for preparing the organic compounds therein, and shutters 206 (206a to 206c). Note here that in the deposition apparatus of this invention, it is recommendable that either the evaporation source or a substrate to be subjected to vacuum evaporation be movably (rotatably) arranged to ensure that film is fabricated uniformly.

Meanwhile, the material chambers 205 (205a to 205c) are made of conductive metal material and have a structure shown in FIG. 17. Note that the organic compounds 204(204a to 204c) are vaporized and then deposited onto a surface of the substrate 200 upon heat up of the internal organic compounds 204 (204a to 204c) due to resistance occurring when a voltage is applied to the material chambers 205 (205a to 205c). Also note that the term "surface of the substrate 200" is to be understood to involve the substrate and more than one thin-film as formed over this substrate, here, an anode is formed on the substrate.

In addition the shutters 206 (206a to 206c) control vacuum evaporation of the vaporized organic compounds 204 (204a to 204c). In brief, when the shutters are opened, it is possible to deposit the vaporized organic compounds 204 (204a to 204c) due to heat application by vacuum evaporation.

Additionally it will be desirable that the organic compounds 204 (204a to 204c) be pre-vaporizable by heat application prior to the vacuum evaporation process for enabling effectuation of any vacuum evaporation immediately after the shutters 206 (206a to 206c) are opened during vacuum evaporation, thus shortening a time period required for deposition.

In addition, in the deposition apparatus embodying the invention, an organic compound layer having a plurality of function regions is formed within a single deposition chamber, evaporation sources 203a to 203c are provided. Organic compounds vaporized at respective evaporation sources 203a to 203c behave to upwardly and then pass through openings (not shown) that are defined in the metal mask 202 to be deposited on the substrate 200.

Initially a first organic compound 204a furnished in the first material chamber 205a is subject to vacuum evaporation. Note here that the first organic compound 204a is vaporized in advance by resistive heat up and thus dispersed in the direction of substrate 200 upon opening of the shutter 206a during vacuum evaporation. Whereby, it is possible to form a first function region 210 shown in FIG. 2B.

And, while letting the first organic compound 204a kept deposited, open another shutter 206b for execution of vacuum evaporation of a second organic compound 204b furnished in the second material chamber 205b. Note that the second organic compound also is pre-vaporized by resistive heat up and thus dispersed in the direction of substrate 200 upon opening of the shutter 206b during vacuum evaporation. Here, it is possible to form a first mixed region 211 which consists essentially of the first organic compound 204a and the second organic compound 204b.

And, after a while, close only the shutter 206a for vacuum evaporation of the second organic compound 204b. Thus it is possible to form a second function region 212.

It should be noted that although one specific method for forming the mixed region through simultaneous vacuum evaporation of two kinds of organic compounds is shown here, it is also possible to form the mixed region between the first function region and second function region by depositing the first organic compound and, thereafter, depositing the second organic compound in the vacuum evaporation environment of the first organic compound.

Next, while letting the second organic compound 204b kept deposited, open a shutter 206c for execution of vacuum evaporation of a third organic compound 204c as has been furnished in the third material chamber 205c. Note that the third organic compound 204c is also pre-vaporized by resistive heat up and thus dispersed in the direction of substrate 200 upon opening of the shutter 206c during vacuum evaporation. Here, it is possible to form a second mixed region 213 which consists essentially of the second organic compound 204b and the third organic compound 204c.

And, after a while close only the shutter 206b for vacuum evaporation of the third organic compound 204c. Thus it is possible to form a third function region 214.

Lastly, a cathode is formed, thereby completing a luminescent element as fabricated by the deposition apparatus of the present invention.

Further, regarding other organic compound layers, as shown in FIG. 2C, after forming a first function region 220 using the first organic compound 204a, form a first mixed region 221 consisting essentially of the first organic compound 204a and the second organic compound 204b, and further form a second function region 222 by using the second organic compound 204b. Then, simultaneously perform vacuum evaporation of third organic compound 204c while letting shutter 206c open temporarily during formation of the second function region 222, thereby forming a second mixed region 223.

After a while, close the shutter 206c to thereby again form the second function region 222. Then form a cathode, thus forming a luminescent element.

It must be noted that in view of the fact that with the deposition apparatus of this invention the deposition is performed by use of the plurality of material chambers within the same deposition chamber, a material chamber with the organic material used for deposition may be designed to move at an optimal location beneath the substrate during deposition process in order to improve the deposition property or, alternatively, the substrate is modified to have a function of moving at an optimal position overlying the material chamber for the same purpose.

Furthermore, the deposition chamber of this invention is provided with an attachment-preventing shield 207 for preventing attachment of organic compounds to the inner wall of such deposition chamber during vacuum evaporation. Providing this attachment-preventing shield 207 makes it possible to deposit those organic compound components that have failed to be deposited on the substrate. Around the attachment-preventing shield 207, a heater 208 is provided in contact therewith, wherein the use of this heater 208 enables the entirety of such attachment-preventing shield 207 to be heated. Additionally, heating the attachment-preventing shield 207 makes it possible to vaporize the organic compounds attached to the shield 207. This in turn makes it possible to achieve successful cleaning of the interior of deposition chamber.

As the deposition apparatus of the invention capable of fabricating the above-discussed organic compound layers enables formation of an organic compound layer having a plurality of function regions within the same deposition chamber, it is possible to form a mixed region at the interface between function regions without letting the function region interface be contaminated by impurities. From the foregoing, it is apparent that a luminescent element comprising multiple functions is manufacturable without showing any distinct multilayer structures (that is, without associating any distinct organic interfaces).

BRIEF DESCRIPTION OF THE DRAWINGS

FIGS. 1A through 1D are diagrams for explanation of an element structure as fabricated by a deposition apparatus of the present invention;

FIGS. 3A and 3B are diagrams explaining about a deposition apparatus;

FIGS. 8A and 8B are diagrams explaining on a deposition apparatus;

FIG. 13 is a diagram for explanation of one typical prior art;

DESCRIPTION OF THE PREFERRED EMBODIMENTS

[Embodiment Mode]

Figure 2A:
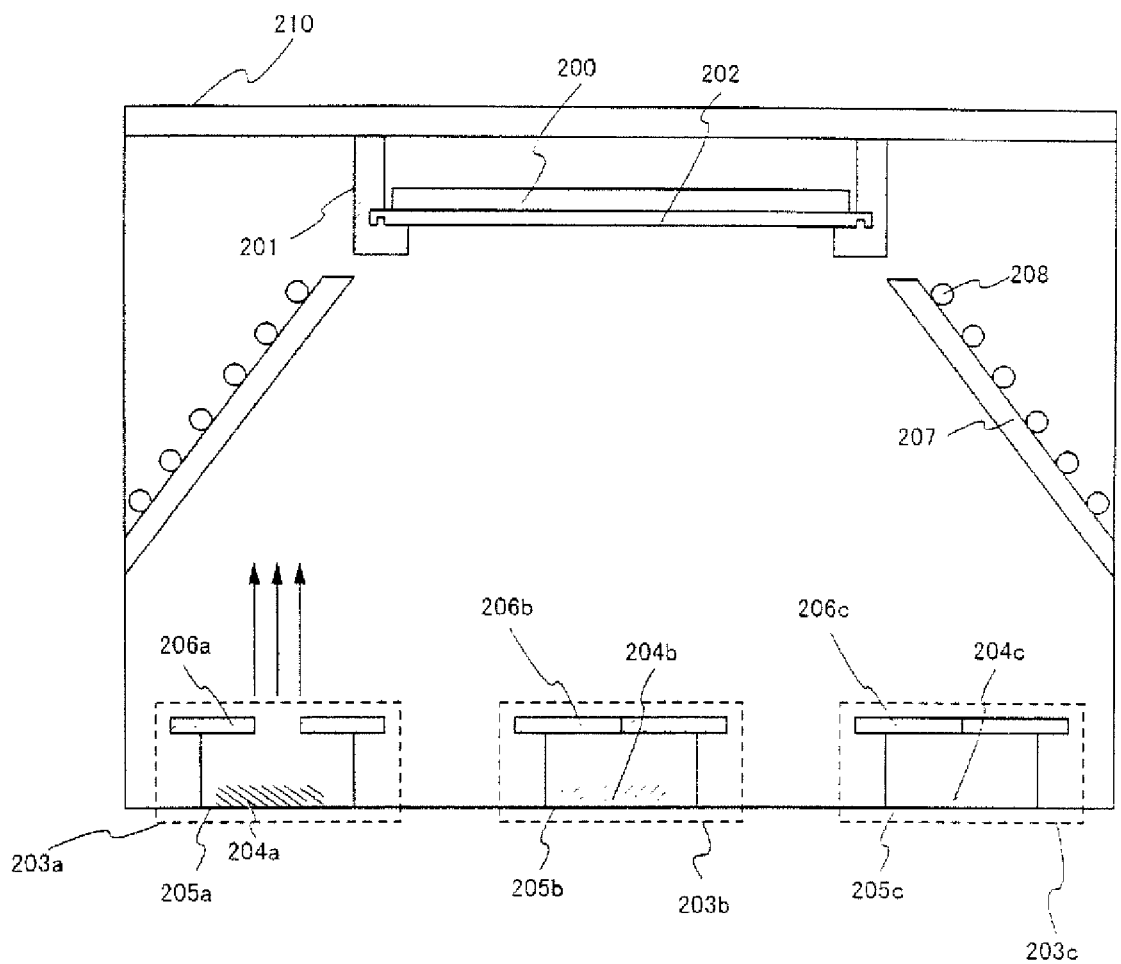
FIG. 2A is a diagram for explanation of a deposition chamber and FIGS. 2B and 2C are diagrams of elements as fabricated by a deposition chamber shown in FIG. 2A.
Figure 2B:
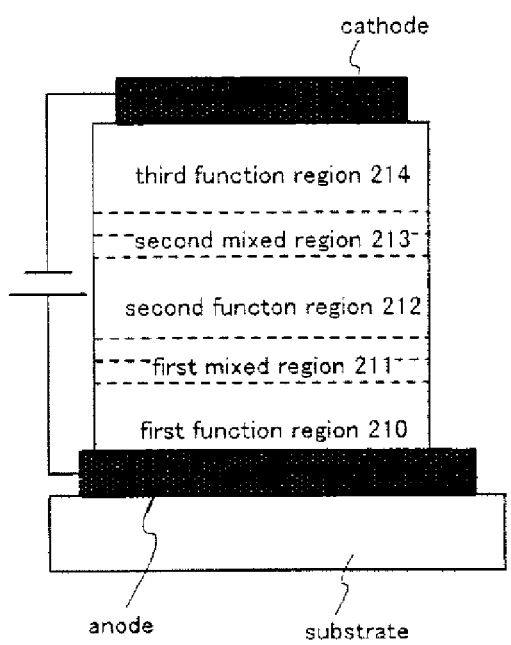
Figure 2C:
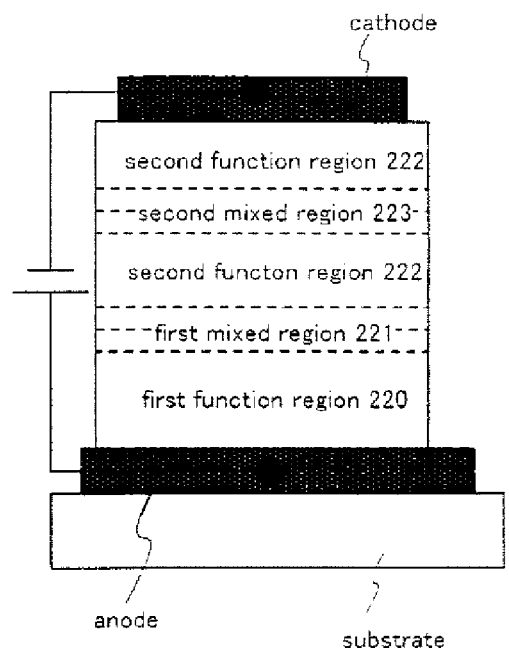

An arrangement of deposition apparatus of the present invention will be explained with reference to FIGS. 3A and 3B. FIG. 3A is a diagram showing an upper plan view of the deposition apparatus, and FIG. 3B shows a cross-sectional view thereof. Note here that common components will be designated by common reference numerals. Also there is shown an example which is arranged so that three kinds of organic compound layers (red, green, blue) are formed in each deposition chamber of a deposition apparatus of the inline scheme having three deposition chambers.

In FIG. 3A, reference numeral "300" denotes a loading chamber, wherein a substrate prepared in this load chamber is transferred toward a first alignment chamber 301. Note that in the first alignment chamber 301, alignment of a metal mask 303 fixed to a holder 302 in advance is done with the holder 302, thereby a substrate 304 of pre-vacuum evaporation is formed on the alignment-finished metal mask 303, wherein one electrode (here, anode) comprising a luminescent element is formed on the substrate 304. Whereby, the substrate 304 and metal mask 303 are made integral together to be transferred toward a first deposition chamber 305.

An explanation will now be given of a positional relationship of the holder 302 for fixation of the metal mask 303 and substrate 304 with reference to FIGS. 4A through 4E. Note that in these drawings, components identical to those of FIGS. 3A and 3B will be denoted by the same reference numerals.

Figure 4A:
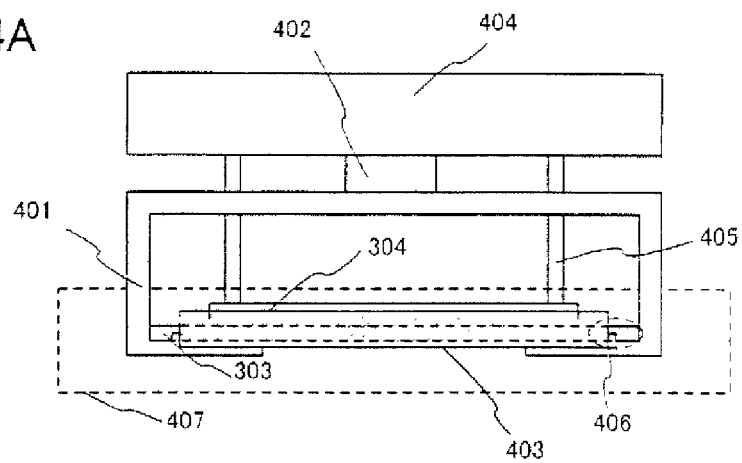
FIGS. 4A through 4E are diagrams for explanation of a metal mask alignment method.

A sectional structure is shown in FIG. 4A. The holder 302 shown herein is generally constituted from a mask holder 401, a shaft 402, a substrate holder 403, control mechanism 404 and auxiliary pins 405. Additionally the metal mask 303 is fixed in a way aligned with a projection 406 on the mask holder 401, with the substrate 304 mounted on the metal mask 303. Additionally the substrate 304 on the metal mask 303 is fixed by the auxiliary pins 405.

Figure 4B:
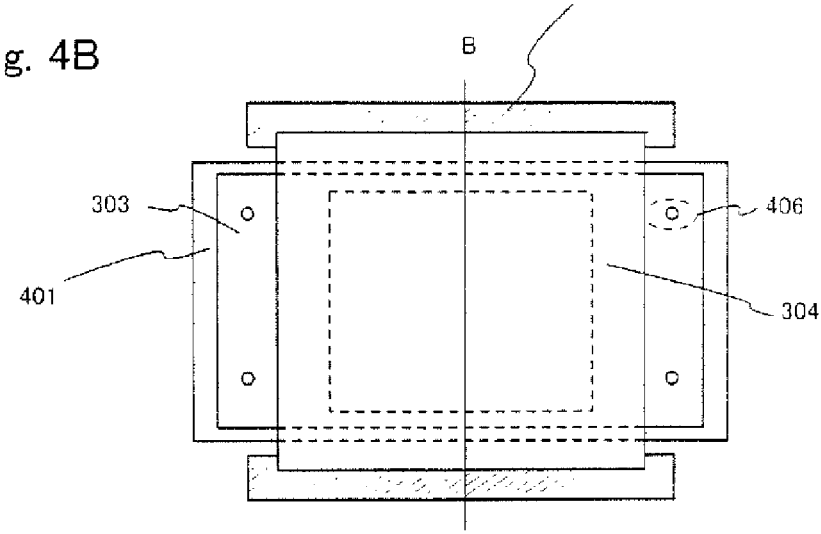

An upper plan view in a region 407 of FIG. 4A is shown in FIG. 4B. Additionally the substrate 304 is fixed by the substrate holder 403 shown in FIG. 4A and FIG. 4B.

Figure 4C:
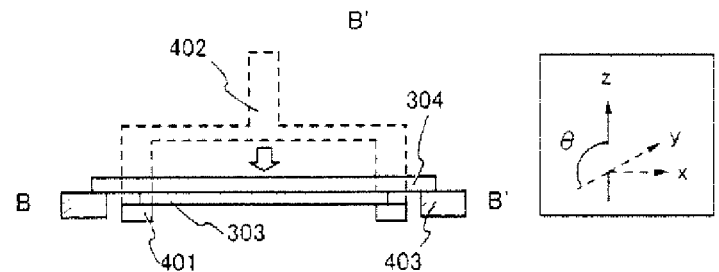

Further, a sectional view as taken along line B-B' of FIG. 4B is shown in FIG. 4C. Assuming that the position of the metal mask 303 shown in FIG. 4C is at the time of deposition, a position of the metal mask 303 shown in FIG. 4D with the shaft 402 moved in Z-axis direction is during alignment process.

Figure 4D:
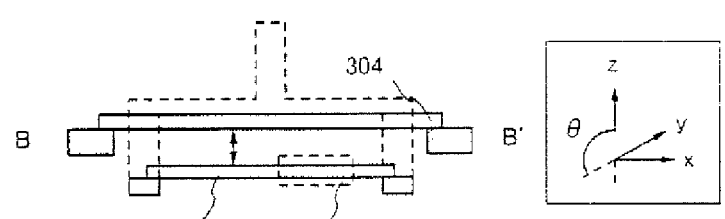

At the process step of FIG. 4D, the shaft 402 is movable in any one of X-axis and Y-axis, and Z-axis directions, further, movement of gradient (B) of an X-Y plane with respect to the Z-axis is also possible. Additionally, the control mechanism 404 outputs a movement information from both a position information obtained from a charge-coupled device (CCD) camera and a position information input therein in advance, thereby the position of the mask holder can be identical with a specified position through the shaft 402 coupled to the control mechanism 404.

Figure 4E:
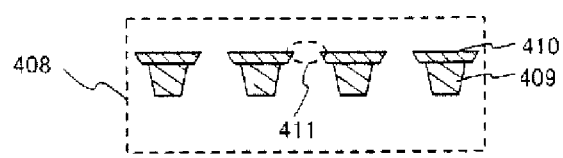

In addition, an enlarged view of the metal mask 303 in a region 408 is shown in FIG. 4E. The metal mask 303 as used herein is structured from a mask a409 and a mask b410 formed using different materials each other. Additionally during vacuum evaporation, organic compounds that have passed through these openings 411 will be fabricated on the substrate. Their shapes are contrived to improve the deposition accuracy upon execution of vacuum evaporation using the masks, and are used in such a manner that the substrate 304 and the mask b410 are in contact with each other.

When alignment of the metal mask 303 is completed, let the shaft move in the Z-axis direction causing the metal mask 303 to again move at the position of FIG. 4C and then let the metal mask 303 and substrate 304 be fixed together by the auxiliary pins 405, thus making it possible to complete the alignment of the metal mask 303 along with the positioning between the metal mask 303 and the substrate 304.

Note that in this embodiment, the openings of the metal mask 303 may be of a rectangular, elliptical, or linear shape, in addition, these may be designed into a matrix-like layout or delta layout.

The first deposition chamber 305 in FIG. 3A is provided with a plurality of evaporation sources 306. Additionally each the evaporation sources 306 consists of a material chamber (not shown) in which organic compounds are prepared and a shutter (not shown) for controlling through open/close operations dispersion of vaporized organic compound in the material chamber toward outside of the material chamber.

In addition, the plurality of evaporation sources 306 provided in the first deposition chamber 305 are provided with organic compounds having different functions for constituting an organic compound layer of a luminescent element, respectively. Note here that the organic compounds as used herein may refer to organic compounds having its nature of hole injectability for receipt of holes from the anode, hole transportability with hole mobility greater than electron mobility, electron transportability with electron mobility greater than hole mobility, electron injectability for receipt of electrons from the cathode, blocking ability for enabling inhibition of movement of either holes or electrons, and luminescent ability exhibiting light emission.

Note here that the organic compound with a high hole injectability may preferably be phthalocyanine-based compound; the organic compound with a high hole transportability is preferably aromatic diamine compound; and, the organic compound with a high electron transportability is preferably a metal complex containing benzoquinoline skeleton, oxadiazole derivative, triazole derivative, or still alternatively phenanthroline derivative. Further, the organic compound exhibiting luminescent ability is preferably a metal complex containing quinoline skeleton, metal complex containing benzooxazole skeleton, or metal complex containing benzothiazole skeleton, which emit a steady light.

In the first deposition chamber 305, the organic compounds provided in these evaporation sources are deposited by a vacuum evaporation in order, using the method discussed in FIG. 2A, resulting in formation of a first organic compound layer (here, red) having a plurality of function regions and mixed regions.

Next, the substrate 304 is transported toward a second alignment chamber 307. In the second alignment chamber 307, after once substrate 304 is separated from the metal mask 303, alignment of the metal mask 303 is done in such a manner that it matches a position whereat a second organic compound layer is to be fabricated. And, after completion of the alignment, the substrate 304 and the metal mask 303 are overlapped with each other and fixed together.

And, transfer the substrate 304 toward a second deposition chamber 308. Similarly the second deposition chamber 308 is also provided with a plurality of evaporation sources. In a similar way to the first deposition chamber 305, a plurality of organic compounds are deposited by a vacuum evaporation in order, resulting in formation of a second organic compound layer (here, green) having a plurality of function regions and mixed regions.

Further, transfer the substrate 304 toward a third alignment chamber 309. In the third alignment chamber 309, after once the substrate 304 is separated from the metal mask 303, alignment of the metal mask 303 is done in such a way that it matches a position whereat a third organic compound layer is to be fabricated. And, after completion of the alignment, the substrate 304 and metal mask 303 are overlapped with each other and fixed together.

And, transfer the substrate 304 to a third deposition chamber 310. Similarly the third deposition chamber 310 is also provided with a plurality of evaporation sources. In a similar way to that of the other deposition chambers, a plurality of organic compounds are deposited by a vacuum evaporation in order, resulting in formation of a third organic compound layer (here, blue) having a plurality of function regions and mixed regions.

Lastly the substrate 304 is transferred to an unload chamber 311 and then taken outwardly of the deposition apparatus.

Performing in this way the alignment of the metal mask 303 in the alignment chamber once at a time whenever a different organic compound layer is formed, a plurality of organic compound layers can be formed within the same apparatus. As function regions consisting of a single organic compound layer is deposited in the same deposition chamber in this way, it is possible to avoid impurity contamination between adjacent function regions. Furthermore in this deposition apparatus, since it is possible to form a mixed region between different function regions, it becomes possible manufacture a luminescent element having multiple functions without indicating any distinct multilayer structures.

Additionally although there is shown in this embodiment a deposition apparatus which operates up to the formation of the organic compound layers, the deposition apparatus of the present invention should not be limited only to this structure and may alternatively be modified to have a structure comprising a deposition chamber in which the cathode is formed on an organic compound layer and a processing chamber capable of sealing the luminescent element. Additionally the deposition order of the organic compound layers which emit red, green and blue light should not be limited to the above-stated one.

Figure 14:
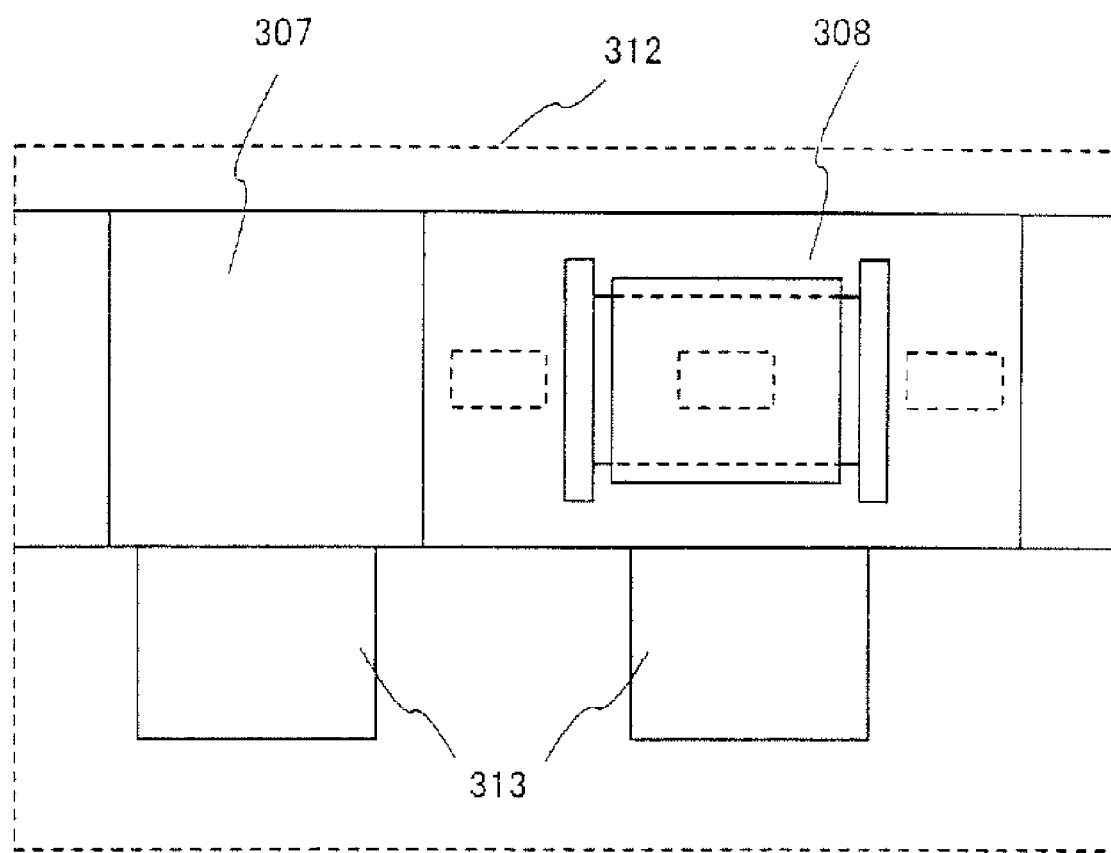
FIG. 14 is a diagram explaining on a deposition apparatus.

Moreover, there may also be provided a means for cleaning the alignment and deposition chambers as indicated in this embodiment mode. Also note that in case such means is provided in the region 312 of FIG. 3, it is possible to provide a cleaning preliminary chamber 313 shown in FIG. 14.

In the cleaning preliminary chamber 313, let radicals generate by decomposition of a reactive gas such as $NT_3$ or $CF_4$ and then introduce them into the second alignment chamber 307 to thereby enable cleaning at the second alignment chamber 307. Note here that the metal mask can be cleanup by providing used metal mask in the second alignment chamber 307 in advance. Also note that introducing the radicals into the second deposition chamber 308 also makes it possible to clean up the inside of the second deposition chamber 308. Additionally the second alignment chamber 307 and second deposition chamber 308 are connected with the cleaning preliminary chamber 313 through gates (not shown) respectively, wherein the gates are designed to open upon introduction of radicals.

[Embodiment 1]

Figure 5:
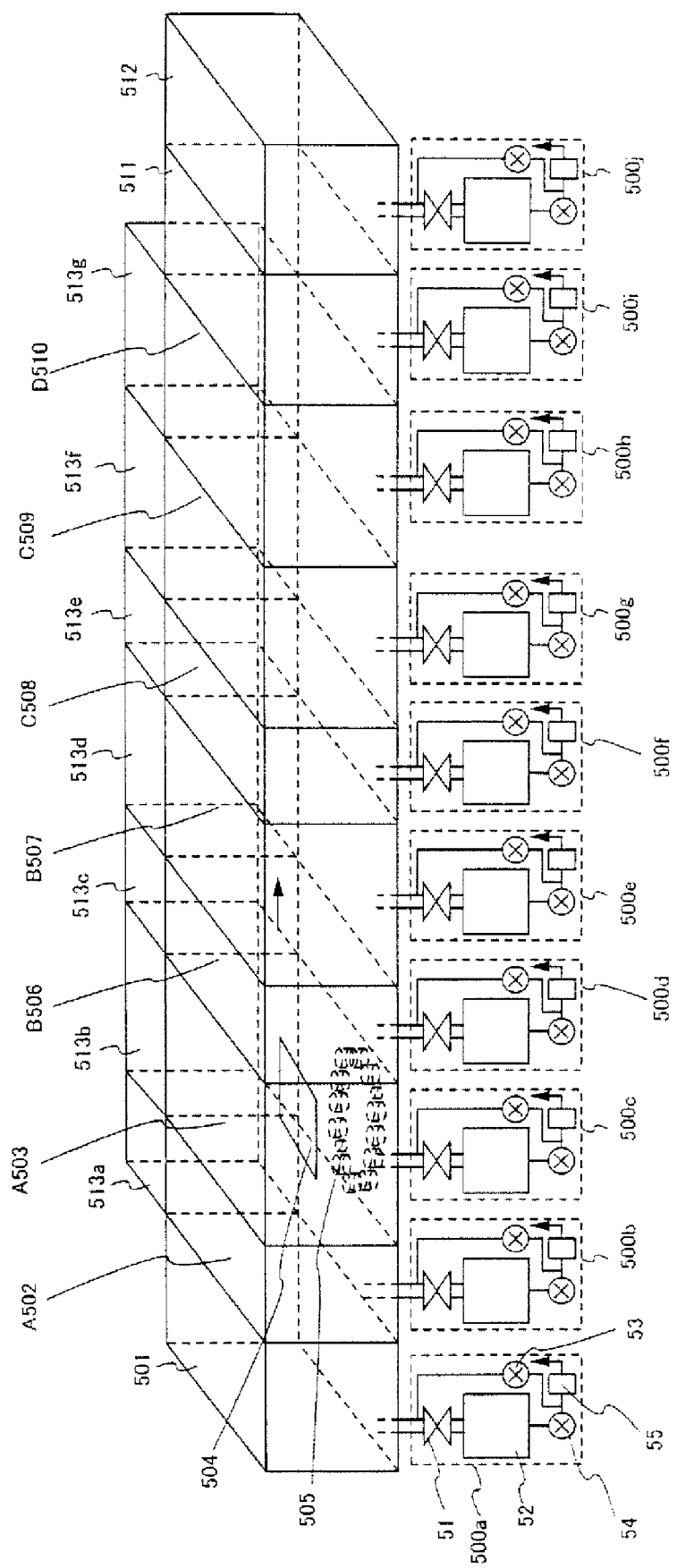
FIG. 5 is a diagram explaining on a deposition apparatus.

An explanation will be given of the case where the deposition apparatus of the present invention is the inline scheme, with reference to FIG. 5. In FIG. 5, reference numeral 501 denotes a load chamber, from which a substrate is transported. Note that the term substrate as used in this embodiment is to be understood to mean the one with either an anode or cathode (anode used in this embodiment) for use as one electrode of a luminescent element being formed thereon. In addition the load chamber 501 comes with a gas exhaust system 500a, wherein this exhaust system 500a is constituted including a first valve 51, a turbo molecular pump 52, a second valve 53, a third valve 54 and a dry pump 55.

Additionally in this embodiment, as the material used for inside of respective processing chambers such as a gate-blocked load chamber, an alignment chamber, a deposition chamber, a sealing chamber and an unloading chamber, a material such as aluminum or stainless steel (SUS) with mirror surfaces through treatment of electro polishing is used on the internal wall planes thereof due to its capability to reduce an adsorption of the impurity such as oxygen and water by making surface area of the inside wall smaller. In addition, internal members made of material such as ceramics or else are employed as the inside material which are treated that pores become extremely less. Note that these materials have surface smoothness with the center average roughness being less than or equal to 30 Å.

Although the first valve 51 is a main valve having a gate valve, a butterfly valve that functions also as a conductance valve will alternatively be used. The second valve 53 and the third valve 54 are fore valves. First, a pressure of the load chamber 501 is roughly reduced by the dry pump 55 with the second valve 53 opened, next, a pressure of the load chamber 501 is reduced to a high degree of vacuum by the turbo molecular pump 52 with the first valve 51 and third valve 54 open. Note that the turbo molecular pump may be replaced with a mechanical booster pump; alternatively, the turbo molecular pump is usable after increased the vacuum degree by the mechanical booster pump.

Next, the one indicated by numeral 502 is an alignment chamber. Here, alignment of a metal mask and positioning of a substrate on the metal mask are done for deposition at a deposition chamber to which it will next be transferred. This will be called alignment chamber A502. Additionally, the method explained in FIGS. 4A through 4E may be employed in the alignment method here. Additionally the alignment chamber A502 comprises a gas exhaust system 500b and is shut and shielded from the load chamber 501 by a gate, not shown.

Further, the alignment chamber A502 is provided with a cleaning preliminary chamber 513a for producing therein radicals by decomposition of a reactive gas such as $NF_3$ or $CF_4$ or else and then introducing this into the alignment chamber A502 to thereby enable of cleanup at the alignment chamber A502. Note that the used metal mask can be cleanup by providing the metal mask in the alignment chamber A502 in advance.

Next, numeral 503 denotes a deposition chamber for fabrication of a first organic compound layer by vacuum evaporation methods, which will be called deposition chamber A503 hereinafter. The deposition chamber A503 comprises an exhaust system 500c. In addition, this is shut and shielded from the alignment chamber A502 by a gate, not shown.

In a similar way to the alignment chamber A502, the deposition chamber A503 is provided with a cleaning preliminary chamber 513b. Note here that the interior of D the deposition chamber A503 can be cleanup by introducing into the deposition chamber A503 radicals produced through decomposition of a reactive gas such as $NF_3$ or $CF_4$ or else.

In this embodiment, a deposition chamber that has the structure shown in FIG. 2A is provided as the deposition chamber A303 for fabrication of the first organic compound layer which emits red light. Additionally provided as the evaporation sources are a first evaporation source provided with an organic compound with hole injectability, a second evaporation source provided with an organic compound with hole transportability, a third evaporation source provided with an organic compound with hole transportability for use as a host of organic compound with luminescent ability, a fourth evaporation source provided with an organic compound with luminescent ability, a fifth evaporation source provided with an organic compound with blocking ability, and a sixth evaporation source provided with an organic compound with electron transportability.

It is also noted that in this embodiment, copper phthalocyanine (abbreviated as "Cu-Pc" hereinafter) is used as the organic compound with hole injectability that provided in the first evaporation source; 4,4-bis [N-(1-naphthyl)-N-phenyl-amino]-biphenyl (abbreviated as "α-NPD" hereafter) is used as the organic compound with hole transportability being provided in the second evaporation source; 4,4'-dicarbazole-biphenyl ("CBP") is used as the organic compound which becomes the host provided in the third evaporation source; 2, 3, 7, 8, 12, 13, 17, 18-octaethyl-21H,23H-porphyrin-platinum ("PtOEP") is used as the organic compound with luminescent ability provided in the fourth evaporation source; bathocuproin ("BCP") is used as the organic compound with blocking ability provided in the fifth evaporation source; and, tris(8-quinolinolat) aluminum ("$Alq_3$") is used as the organic compound with electron transportability provided in the sixth evaporation source.

It is noted that the organic compound layer comprising regions having the functions of hole injectability, hole transportability, luminescent ability, and electron transportability can be formed over the anode by depositing these organic compound in order through a vacuum evaporation.

Also note that in this embodiment, a mixed region is formed at an interface between different function regions by simultaneous vacuum evaporation of organic compounds consisting of both function regions. To be brief, mixed regions are formed respectively at an interface between the hole injection region and the hole transport region and at an interface between the hole transport region and the electron transport region including a luminescent region.

Practically, after formed a first function region through deposition of Cu-Pc to a thickness of 15 nm, both Cu-Pc and α-NPD are deposited by a vacuum evaporation at a same time to thereby form a first mixed region with a film thickness of 5 to 10 nm. Then, fabricate a film of α-NPD to a thickness of 40 nm to thereby form a second function region, followed by formation of a second mixed region with a thickness of 5 to 10 nm by simultaneous vacuum evaporation of α-NPD and CBP. Thereafter, fabricate a film of CBP to a thickness of 25 to 40 nm, thus forming a third function region. At the step of forming the third function region, both CBP and PtOEP are deposited at a same time, thereby forming a third mixed region at the entirety or part of the third function region. Note here that the third mixed region has luminescent ability. Further, both CBP and BCP are deposited by simultaneous vacuum evaporation to a film thickness of 5 to 10 nm, thereby forming a fourth mixed region. In addition, a BCP film is fabricated to a thickness of 8 nm, thus forming a fourth function region. Furthermore, BCP and $Alq_3$ are deposited by simultaneous vacuum evaporation to a film thickness of 5 to 10 nm, resulting in formation of a fifth mixed region. Lastly a film of $Alq_3$ is formed to a thickness of 25 nm, thus enabling formation of a fifth function region. With the above process steps, a first organic compound layer is thus formed.

It should be noted that in the above explanation concerning the first organic compound layer six kinds of organic compounds different in function from one another are provided in six evaporation sources respectively and the organic compound layer is then formed by vacuum evaporation of these organic compounds. The present invention should not be limited only to the above and may use a plurality of organic compounds. Additionally the organic compound provided in a single evaporation source should not always be limited to a single one and may alternatively be multiple ones. For example, in addition to a single kind of material provided in an evaporation source as an organic compound with luminescent ability, another organic compound that serve as a dopant may be provided together. Note that the first organic compound layer has a plurality of functions and prior known materials may be used as these organic compounds composing an organic compound layer which emits the red light.

It is to be noted that the evaporation sources may be designed so that a microcomputer is used to control the deposition speeds thereof. Additionally, with this arrangement, it is preferable to control the ratio of mixture upon simultaneous fabrication of a plurality of organic compound layers.

Next, the one indicated by numeral 506 is an alignment chamber. Here, alignment of a metal mask and positioning of a substrate on the metal mask are done for deposition at a deposition chamber to which it will next be transferred. This will be called an alignment chamber B506. Additionally, the method explained in FIGS. 4A through 4E may be employed in the alignment method here. Additionally the alignment chamber B506 comprises a gas exhaust system 500$d$ and is shut and shielded from the deposition chamber A503 by a gate not shown. It further comprises a cleaning preliminary chamber 513$c$ that is shut and shielded from the alignment chamber B506 by a gate not shown, in a similar way to the alignment chamber A502.

Next, numeral 507 denotes a deposition chamber for fabrication of a second organic compound layer by vacuum evaporation, which will be called the deposition chamber B507. This deposition chamber B507 is provided with an exhaust system 500$e$. In addition it is shut and shielded from the alignment chamber B506 by a gate, not shown. Further, it comprises a cleaning preliminary chamber 513$d$ which is shut and shielded from the deposition chamber B507 by a gate not shown, in a similar way to the deposition chamber A503.

In this embodiment a deposition chamber with the structure shown in FIG. 2A is provided as the deposition chamber B507 for fabrication of a second organic compound layer which emits green light. Additionally provided as the evaporation sources are a first evaporation source provided with an organic compound with hole injectability, a second evaporation source and a third evaporation source each provided with organic compounds with hole transportability, a fourth evaporation source provided with a host material with hole transportability, a fifth evaporation source provided with an organic compound with luminescent ability, a sixth evaporation source provided with an organic compound with blocking ability, and a seventh evaporation source provided with an organic compound with electron transportability.

It is noted that in this embodiment, Cu-Pc is employed as the organic compound with hole injectability provided in the first evaporation source; MTDATA is employed as the organic compound with hole transportability provided in the second evaporation source; α-NPD is employed as the organic compound with hole transportability provided in the third evaporation source; CBP is employed as the host material with hole transportability provided in the fourth evaporation source; tris(2-phenylpyridine) iridium $(Ir(ppy)_3)$ is employed as the organic compound with luminescent ability provided in the fifth evaporation source; BCP is employed as the organic compound with blocking ability provided in the sixth evaporation source; and, $Alq_3$ is employed as the organic compound with electron transportability provided in the seventh evaporation source.

It is noted the second organic compound layer can be formed over the anode by successive vacuum evaporation of these organic compounds, which comprises regions having functions of hole transportability, luminescent ability, blocking ability and electron transportability.

Also note that in this embodiment, a mixed region is formed at an interface between different function regions by simultaneous vacuum evaporation of organic compounds forming both the function regions. More specifically, mixed regions are formed respectively at an interface between the hole transport region and the blocking region and at an interface between the blocking region and the electron transport region.

Practically, after formed a first function region through deposition of Cu-Pc to a thickness of 10 nm, both Cu-Pc and MTDATA are deposited by a vacuum evaporation at a same time to thereby form a first mixed region with a film thickness of 5 to 10 nm. Then, fabricate a film of MTDATA to a thickness of 20 nm to thereby form a second function region, followed by formation of a second mixed region with a thickness of 5 to 10 nm by simultaneous vacuum evaporation of MTDATA and α-NPD. Thereafter fabricate a film of α-NPD to a thickness of 10 nm, thereby forming a third function region. Then, by simultaneous vacuum evaporation of α-NPD and CBP, a third mixed region is formed in thickness from 5 to 10 nm. Subsequently, fabricate a film of CBP to a thickness of 20 to 40 nm to thereby form a fourth function region. At the step of forming the fourth function region, $(Ir(ppy)_3)$ is deposited by simultaneous vacuum evaporation at part or entirety of the fourth function region, thus forming a fourth mixed region; then, simultaneously deposited CBP and BCP by vacuum evaporation to form a fifth mixed region with a thickness of 5 to 10 nm; next, deposit a BCP film of 10-nm thickness to thereby form a fifth function region; next, simultaneously deposit BCP and $Alq_3$ by vacuum evaporation to form a sixth mixed region with a film thickness of 5 to 10 nm; lastly, form a film of Alq₃ to a thickness of 40 nm, thus forming a sixth function region to thereby form a second organic compound layer.

Noted that in the above explanation the organic compound layer is formed by vacuum evaporation from seven evaporation sources provided with organic compounds having different functions respectively as the second organic compound layer. The present invention should not be limited only to the above and is modifiable as far as a plurality of evaporation sources. Additionally prior known materials may be used as organic compounds with a plurality of functions for forming an organic compound layer which emits green light.

Next, the one indicated by numeral 508 is an alignment chamber. Here, alignment of a metal mask and positioning of a substrate on the metal mask are done for deposition at a deposition chamber to which it will next be transferred. This will be called an alignment chamber C508. Additionally, the method explained in FIGS. 4A through 4E may be employed in the alignment method here. Additionally the alignment chamber C508 comprises a gas exhaust system 500*f* and is shut and shielded from the deposition chamber B507 by a gate not shown. It further comprises a cleaning preliminary chamber 513*e* that is shut and shielded from the alignment chamber C508 by a gate not shown, in a similar way to the alignment chamber A502.

Next, numeral 509 denotes a deposition chamber for fabrication of a second organic compound layer by vacuum evaporation, which will be called the deposition chamber C509. This deposition chamber C509 is provided with an exhaust system 500*g*. In addition it is shut and shielded from the alignment chamber C508 by a gate not shown. Further, it comprises a cleaning preliminary chamber 513*f* which is shut and shielded from the deposition chamber C509 by a gate not shown, in a similar way to the alignment chamber A503.

In this embodiment a deposition chamber with the structure shown in FIG. 2A is provided as the deposition chamber C509 for fabrication of a third organic compound layer which emits blue light. Additionally provided as the evaporation sources are a first evaporation source provided with an organic compound with hole injectability, a second evaporation source provided with organic compound with luminescent ability, a third evaporation source provided with blocking ability, a fourth evaporation source provided with an organic compound with electron transportability. It is noted that in this embodiment, Cu-Pc is employed as the organic compound with hole injectability provided in the first evaporation source; α-NPD is employed as the organic compound with luminescent ability provided in the second evaporation source; BCP is employed as the organic compound with blocking ability provided in the third evaporation source; and, Alq₃ is employed as the organic compound with electron transportability provided in the fourth evaporation source.

It is noted the third organic compound layer can be formed over the anode by successive vacuum evaporation of these organic compounds, which comprises regions having functions of hole injectability, luminescent ability, blocking ability and electron transportability.

Also note that in this embodiment, a mixed region is formed at an interface between different function regions by simultaneous vacuum evaporation of organic compounds forming both the function regions. More specifically, mixed regions are formed respectively at an interface between the luminescent region and the blocking region and at an interface between the blocking region and the electron transport region.

Practically, after formed a first function region through deposition of Cu-Pc to a thickness of 20 nm, both Cu-Pc and α-NPD are deposited by a vacuum evaporation at a same time to thereby form a first mixed region with a film thickness of 5 to 10 nm. Then, fabricate a film of α-NPD to a thickness of 40 nm to thereby form a second function region, followed by formation of a second mixed region with a thickness of 5 to 10 nm by simultaneous vacuum evaporation of α-NPD and BCP. Thereafter fabricate a film of BCP to a thickness of 10 nm, thereby forming a third function region. Then, by simultaneous vacuum evaporation of BCP and Alq₃, a third mixed region is formed in thickness from 5 to 10 nm; lastly, form a film of Alq₃ to a thickness of 40 nm, to thereby form a third organic compound layer.

Noted that in the above explanation the organic compound layer is formed by successive vacuum evaporation from fourth evaporation sources provided with four organic compounds having different functions respectively as the third organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Note that prior known materials may be used as organic compounds with a plurality of functions for forming an organic compound layer which emits blue light.

Additionally in this embodiment, one specific case has been explained where the organic compound layer which emits red light is formed in the first deposition chamber A503 while forming the organic compound layer which emits green light in the second deposition chamber B507 and also forming the organic compound layer which emits blue light in the third deposition chamber C509. However, the order of formation of these layers should not be limited only the above order. One of the organic compound layers which emit lights of red, green, and blue, respectively may be formed within one of the deposition chamber A503, deposition chamber B507, and deposition chamber C509. Still alternatively, an additional deposition chamber may be provided for forming an organic compound layer which emits white light therein.

Next, numeral 510 denotes a deposition chamber for formation of a conductive film being either the anode or the cathode of a luminescent element (a metal film used as the cathode in this embodiment) by vacuum evaporation, which will be called the deposition chamber D510. The deposition chamber D510 comprises an exhaust system 500*h*, in addition, is shut and shielded from the deposition chamber C509 by a gate not shown. Further, it comprises a cleaning preliminary chamber 513*g* which is sealed and shielded from the deposition chamber D510 by a gate not shown, in a similar manner to that of the deposition chamber A503.

In this embodiment a deposition chamber with the structure shown in FIG. 2A is provided as the deposition chamber D510. Accordingly, in regard to a detailed operation of the deposition chamber D510, refer to the explanation of FIG. 2A.

In this embodiment, in the deposition chamber D510, an Al—Li alloy film (film made of an alloy of aluminum and lithium) is deposited as the conductive film used as the cathode of the luminescent element. Additionally it will also possible to employ co-vacuum evaporation of aluminum and an element belonging to either the group I or group II of the periodic table.

Alternatively a CVD chamber may be provided here for formation of an insulating film such as a silicon nitride film, silicon oxide film and DLC film or else as a protective film (passivation film) of the luminescent element. Note that in the case of providing such CVD chamber, it will be preferable that a gas purifying machine be provided for increasing in advance the purity of a material gases used in the CVD chamber.

Next, numeral 511 denotes a sealing chamber, which comprises an exhaust system 500i. In addition, it is shut and shielded from the deposition chamber D510 by a gate not shown. In the seal chamber 511, processing is to be done for finally enclosing a luminescent element in a sealed space. This processing is the treatment for protecting the luminescent element formed against oxygen and water, and employs a means for mechanically enclosing it by a cover material or alternatively for enclosing it by either thermally hardenable resin or ultraviolet-ray hardenable resin material.

While the cover material used may be glass, ceramics, plastic or metal, the cover material must have optical transmissivity in cases where light is emitted toward the cover material side. Additionally the cover material and a substrate with the above-stated luminescent element formed thereon are adhered together by use of a seal material such as thermal hardenable resin or ultraviolet-ray hardenable resin or else, thereby forming an air-tight sealed space by letting the resin be hardened through thermal processing or ultraviolet ray irradiation processing. It is also effective to provide in this sealed space a moisture absorbable material, typical example of which is barium oxide.

It will also be possible to fill the space between the cover material and the substrate having the luminescent element formed thereon with either thermal hardenable resin or ultraviolet-ray hardenable resin. In this case, it is effective to add a moisture absorption material typically such as barium oxide into either the thermal hardenable resin or ultraviolet-ray hardenable resin.

In the deposition apparatus shown in FIG. 5, a mechanism for irradiation of ultraviolet light to the interior of the seal chamber 511 (referred to as the "ultraviolet light irradiation mechanism" hereinafter) is provided, which is arranged so that ultraviolet light as emitted from this ultraviolet light irradiation mechanism is used to harden the ultraviolet-ray hardenable resin.

Lastly, numeral 512 is an unload chamber, which comprises an exhaust system 500j. The substrate with luminescent element formed thereon will be taken out of here.

Figure 6A:
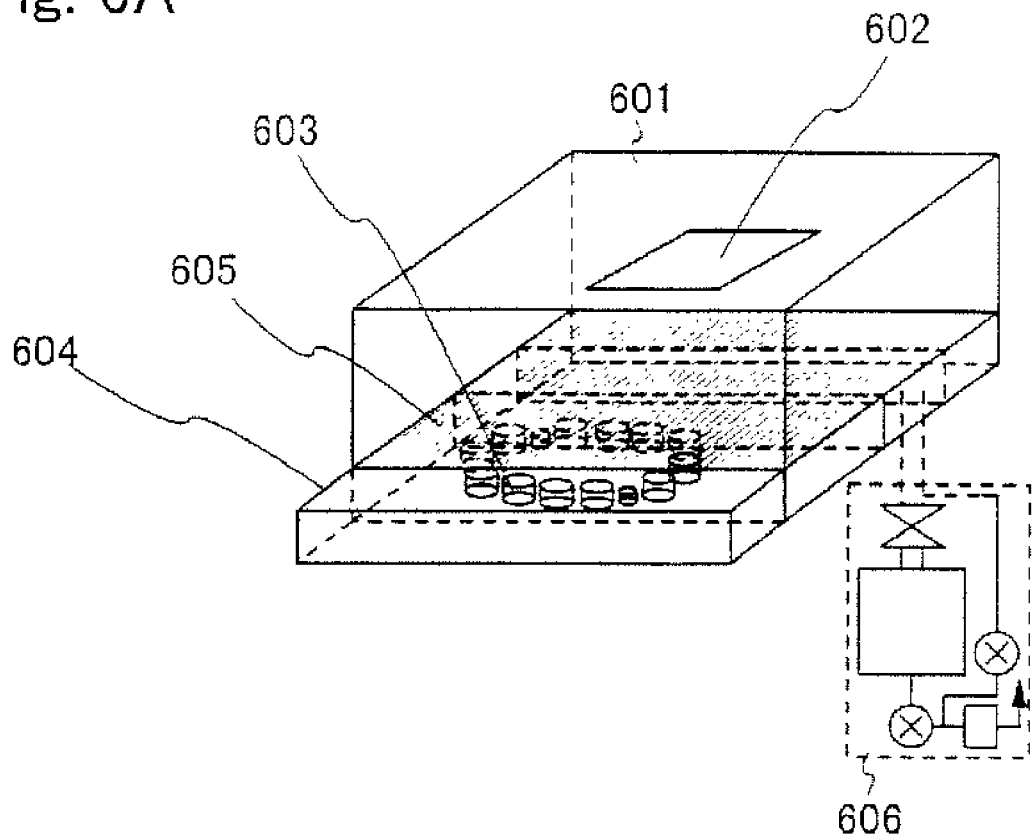
FIGS. 6A and 6B are diagrams explaining on a deposition chamber.
Figure 6B:
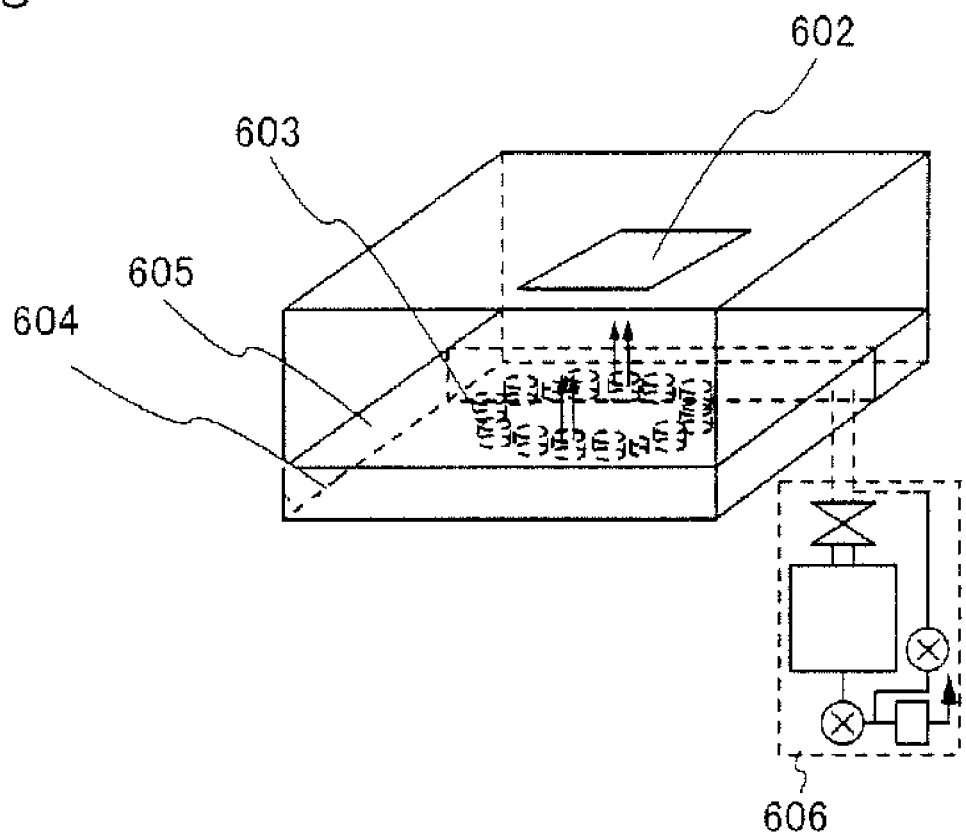

Further/the deposition apparatus indicated in this embodiment may be provided with a function of enabling replacement of an organic compound as shown in FIGS. 6A and 6B. In FIGS. 6A and 6B, a deposition chamber 601 comprises a substrate 602. And an organic compound for formation of an organic compound layer on the substrate is provided in an evaporation source 603. Note that, here, a evaporation source 603 is provided in a material exchange chamber 604 separated from the deposition chamber 601 with the substrate furnished therein through a gate 605. Accordingly, in this embodiment, the material exchange chamber 604 is separated from the deposition chamber 601 by closure of the gate 605, organic compounds furnished in the evaporation source of the material exchange chamber 604 can be added or exchange by returning the interior of the material exchange chamber 604 to an atmospheric pressure via an exhaust system 606 and then taking the organic compounds out as shown in FIG. 6A.

And, after finished addition or exchange of the organic compounds, the material exchange chamber 604 is returned to its original state again as shown in FIG. 6B, then, interior of the material exchange chamber 604 is set in a vacuum state by the exhaust system 606, and, after it has become the same pressure condition as the interior of deposition chamber, open the gate 605. Thus it is possible of vacuum evaporation from the evaporation source 603 to the substrate 602.

Note that the material exchange chamber 604 is provided with a heater for heating the material thus exchanged. Preheating the material makes it possible to remove away impurities such as water or the like. It will be desirable that a temperature applied at this time be equal to or less than 200° C.

As described the above, by using the deposition apparatus shown in FIG. 5 (or FIGS. 6A and 6B), exposure of the luminescent element to the outside air is avoided until the luminescent element is completely enclosed in the sealed space. Thus, it is possible to manufacture a luminescent device with high reliability.

[Embodiment 2]

Figure 7A:
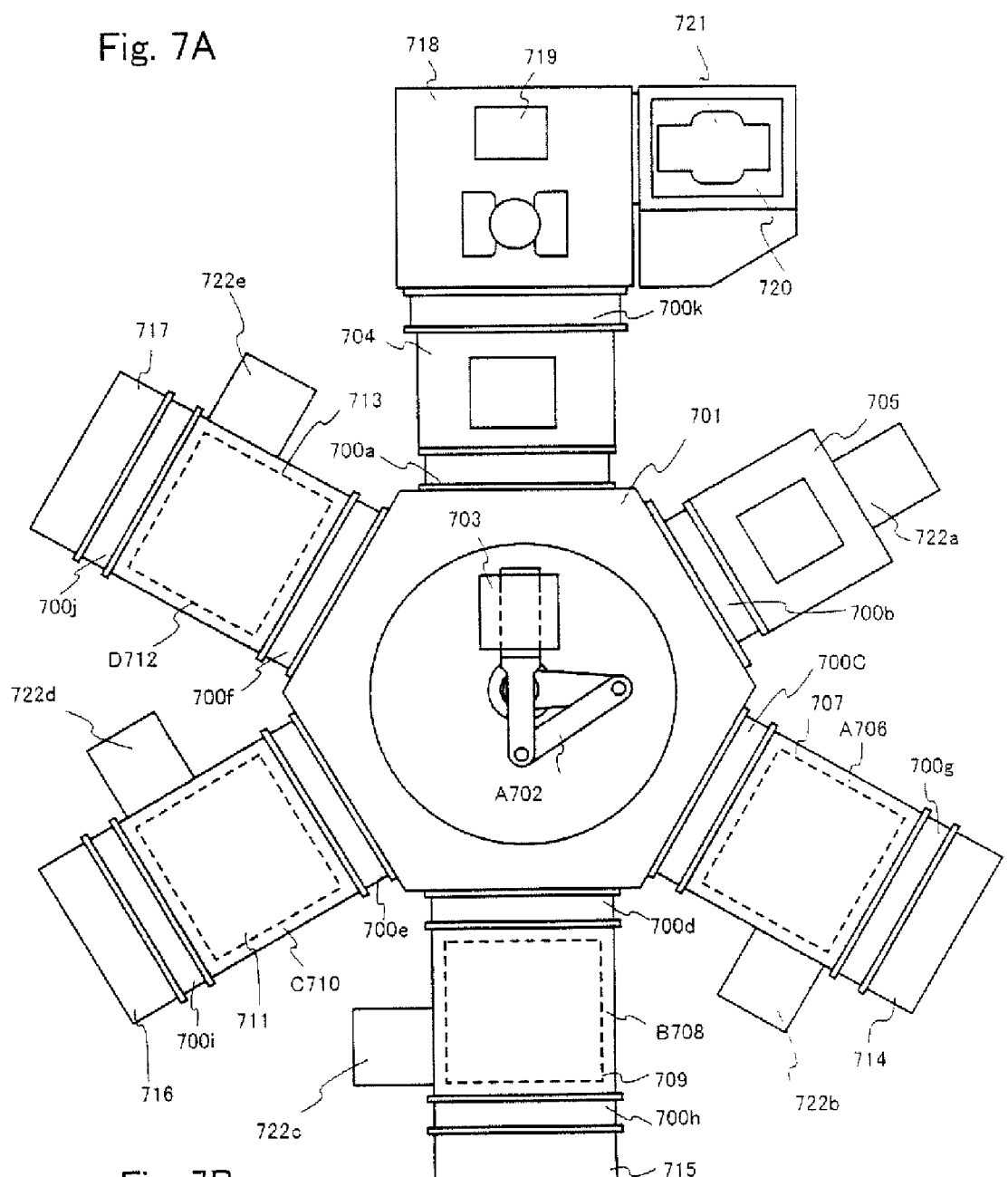
FIGS. 7A and 7B are diagrams explaining on a deposition apparatus.
Figure 7B:
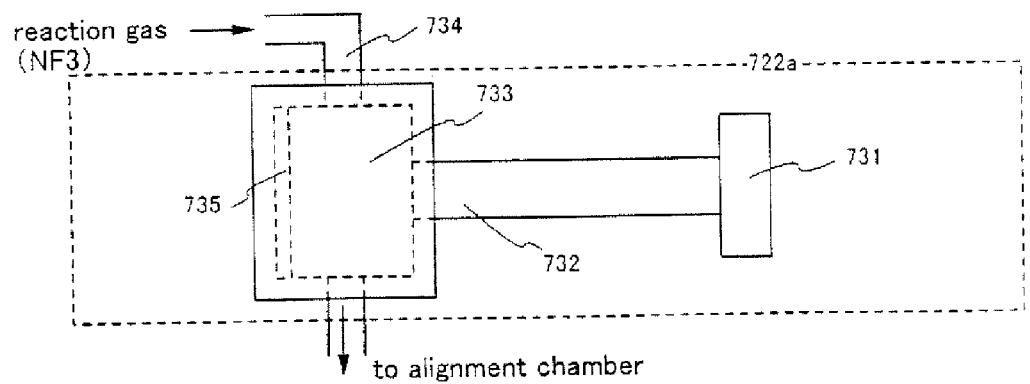

A deposition apparatus of the present invention will be explained with reference to FIGS. 7A and 7B. In FIGS. 7A and 7B, reference numeral 701 denotes a transfer chamber, wherein this transfer chamber 701 comprises a transfer mechanism A702 for performing transport of a substrate 703. The transfer chamber 701 is set in a pressure-reduced atmosphere and is coupled by a gate with each processing chamber. A substrate is transported to each processing chamber by the transfer mechanism A702 upon opening of the gate. Additionally while exhaust pump such as a dry pump, a mechanical booster pump, a turbo molecular pump (magnetic floatation type) or cryopump is employable for pressure reduction of the transfer chamber 701, the turbo molecular pump of the magnetic flotation type is preferable in order to obtain high-degree vacuum states with higher purity.

An explanation will be given of each processing chamber below. Note that the transfer chamber 701 is set in a pressure-reduced atmosphere so that all the processing chambers directly coupled to the transfer chamber 701 are provided with vacuum pumps (not shown). While dry pumps, mechanical booster pumps, turbo molecular pumps (magnetic floatation type) or cryopumps are employable as the vacuum pumps, the turbo molecular pumps of the magnetic flotation type are preferable in this case also.

First, numeral 704 denotes a load chamber for performing setting (installation) of a substrate. The load chamber 704 is coupled by a gate 700a with the transfer chamber 701, at here a carrier (not shown) with a substrate 703 mounted thereon is arranged. Additionally the load chamber 704 can also do double-duty as a chamber that transfers a substrate which element formation is finished toward the sealing chamber. Additionally the load chamber 704 may alternatively have separated rooms for carry-in of the substrate and for carry-out of the substrate. Note that the load chamber 704 comprises the above described vacuum pomp and a purge line for introduction of a high-purity nitride gas or noble gas. Additionally the vacuum pump used herein is preferably a turbo molecular pump. Further, this purge line is provided with a gas refining machine for removal in advance of impurities (oxygen and water) of such gases to be introduced into the apparatus.

It is also noted that in this embodiment, a substrate which a transparent conductive film used as the anode of luminescent element is formed thereon is used as the substrate 703. In this embodiment the substrate 703 is set in a carrier with its deposition surface being directed downwardly. This is for performing of face-down scheme (also known as "depo-up" scheme) when later performing deposition by vacuum evaporation methods. The face-down scheme is to be understood to mean a scheme for performing deposition while letting the deposition surface of a substrate being directed downwardly. With this scheme, it is possible to suppress attachment of contaminant particles such as dusts.

Next, the one indicated by numeral 705 is an alignment chamber for alignment of a metal mask and for matching position between a metal mask and a substrate with either the anode or the cathode of luminescent element (anode in this embodiment) formed thereon, wherein the alignment chamber 705 is coupled by a gate 700b with the transfer chamber 701. Note that a process in combination of the metal mask alignment and positioning of the substrate and metal mask is done within the alignment chamber, once at a time whenever a different organic compound layer is formed. In addition, the alignment chamber 705 comprises a charge-coupled device (CCD) known as an image sensor, thereby making it possible to accurately perform position alignment of the substrate and its associated metal mask in deposition using the metal mask. Note that with respect to metal mask alignment, the method discussed in FIGS. 4A through 4E may be used.

Further, a cleaning preliminary chamber 722a is coupled to the alignment chamber 705. An arrangement of the cleaning preliminary chamber 722a is as shown in FIG. 7B. First, the cleaning preliminary chamber 722a has a μ-wave oscillator 731 for generation of μ waves, wherein μ waves generated at here will be sent through a wave guide tube 732 toward a plasma discharge tube 733. Note that μ waves of about 2.45 GHz are radiated from the μ wave oscillator 731 used here. In addition, a reactive gases are supplied to the plasma discharge tube 733 from a gas inlet tube 734. Additionally here, $NF_3$ is used as the reactive gas, although other gases such as $CF_4$ and $ClF_3$ may be used as reactive gases.

And, the reactive gas is decomposed by μ wave in the plasma discharge tube 733, causing radicals to generate. These radicals are guided to pass through the gas inlet tube 734 to introduce the alignment chamber 705 as coupled via a gate (not shown) thereto. Additionally the plasma discharge tube 733 may be provided with a reflection plate 735 for efficient supplement of μ waves.

And, the alignment chamber 705 comprises a metal mask with an organic compound layer attached thereto. And open a gate (not shown) provided between the cleaning preliminary chamber 722a and the alignment chamber 705, thereby enabling introduction of radicals into the alignment chamber 705. This makes it possible to perform cleaning of the metal mask.

As the use of μ-wave plasma makes it possible to perform radicalization of a reactive gas with high efficiency, the rate of creation of impurities such as side products or the like is low. In addition, since it is different in mechanism from standard radical production, the resultant radicals will no longer be accelerated and radical is not produced within the interior of the deposition chamber. This makes it possible to prevent damages within the deposition chamber due to the presence of a plasma and also damages of the metal mask.

It should be noted that the technique for cleaning the alignment chamber by use of the thus method is one of the preferred modes of the present invention so that this invention should not be limited thereto. Accordingly, it may also be performed a dry cleaning by introducing reactive gases into the deposition chamber to thereby produce a plasma within this deposition chamber, alternatively, a physical cleaning by sputter methods through introduction of an Ar gas or else.

Next, numeral 706 denotes a deposition chamber used for deposition of an organic compound layer by vacuum evaporation method, which will be called the deposition chamber A706 hereinafter. The deposition chamber A706 is coupled via a gate 700c to the transfer chamber 701. In this embodiment a deposition chamber with the structure shown in FIG. 2A is provided as the deposition chamber A706.

With this embodiment, a first organic compound layer capable of emitting red light is formed at a deposition unit 707 within the deposition chamber A706. A plurality of evaporation sources are provided with the deposition chamber A706, practically, there are provided a first evaporation source comprising an organic compound material with hole injectability, a second evaporation source comprising an organic compound with hole transportability, a third evaporation source comprising an organic compound with luminescent ability, and a fourth evaporation source comprising an organic compound with electron transportability.

Note that by successive vacuum evaporation of these organic compounds sequential vacuum evaporation, the organic compound layer can be formed above the anode, which comprises regions having functions of hole injectability, hole transportability, luminescent ability and electron transportability.

Additionally in this embodiment, a mixed region is formed at an interface between different function regions by simultaneous vacuum evaporation of organic compounds forming such both function regions. More specifically, several mixed regions are formed at an interface between the hole injection region and the hole transport region, at an interface between the hole transport region and the luminescent region, and at an interface between the luminescent region and electron transport region, respectively.

Noted that in the above explanation the organic compound layer is formed by successive vacuum evaporation from four evaporation sources provided with four organic compounds having different functions respectively as the first organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Additionally, as the organic compounds having the plurality of functions and forming the organic compound layer which emits red light, the ones as indicated in Embodiment 1 is employable, although known materials are freely used in combination where necessary.

It is also noted that the deposition chamber A706 is coupled via a gate 700g to a material exchange chamber 714. Also note that the material exchange chamber 714 is provided with a heater for heating organic compounds exchanged. Preheating such organic compounds makes it possible to remove impurities such as water or the like. It will be desirable that a temperature being applied here be 200° C. or below. In addition, since the material exchange chamber 714 is provided with a vacuum pump capable of setting its interior in a pressure reduction, let the interior be set in such vacuum pressure state after heat up processing by addition or exchange of an organic compound from the outside. And, when it becomes the same pressure state as that within the deposition chamber, open the gate 700g to thereby enable the evaporation source within the deposition chamber to be provided with an organic compound. Additionally the organic compound is provided at the evaporation source within the deposition chamber by means of a transfer mechanism.

Additionally, regarding the deposition process within the deposition chamber A706, refer to the explanation of FIG. 2A.

Note that in a similar way to the alignment chamber 705, a cleaning preliminary chamber 722b is coupled to the deposition chamber A706 via a gate (not shown). Additionally its practical arrangement is similar to that of the cleaning preliminary chamber 722a, thus, it is possible by introducing radicals generated in the cleaning preliminary chamber 722b into the deposition chamber A706 to remove organic compounds and the like being internally attached to the deposition chamber A706.

Next, numeral 708 denotes a deposition chamber used for deposition of a second organic compound layer by vacuum evaporation method, which will be called the deposition chamber B708 hereinafter. The deposition chamber B708 is coupled via a gate 700d to the transfer chamber 701. In this embodiment a deposition chamber with the structure shown in FIG. 2A is provided as the deposition chamber B708. With this embodiment, the second organic compound layer capable of emitting green light is formed at a deposition unit 709 within the deposition chamber B708.

A plurality of evaporation sources are provided with the deposition chamber B708, practically, there are provided a first evaporation source comprising an organic compound with hole transportability, a second evaporation source comprising an organic compound with luminescent ability, a third evaporation source comprising an organic compound with blocking ability, and a fourth evaporation source comprising an organic compound with electron transportability.

Note that sequential vacuum evaporation of these organic compounds makes it possible to form on the anode an organic compound layer consisting essentially of regions having functions of hole transportability, luminescent ability, blocking ability and electron transportability.

Additionally in this embodiment, a mixed region is formed at an interface between different function regions by simultaneous vacuum evaporation of organic compounds forming such both function regions. More specifically, several mixed regions are formed at an interface between the hole transport region and the luminescent region, at an interface between the luminescent region and the blocking region, and at an interface between the blocking region and electron transport region, respectively.

Noted that in the above explanation the organic compound layer is formed by successive vacuum evaporation from four evaporation sources provided with four organic compounds having different functions respectively as the second organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Additionally, as the organic compounds having the plurality of functions and forming the organic compound layer which emits green light, the ones as indicated in Embodiment 1 is employable, although known materials are freely used in combination where necessary.

It is also noted that the deposition chamber B708 is coupled via a gate 700h to a material exchange chamber 715. Also note that the material exchange chamber 715 is provided with a heater for heating organic compounds exchanged. Preheating such organic compounds makes it possible to remove impurities such as water or the like. It will be desirable that a temperature being applied here be 200° C. or below. In addition, since the material exchange chamber 715 is provided with a vacuum pump so that after introducing organic compounds from the outside it is possible to set its interior in a pressure reduction by the vacuum pump. And, when it becomes the same pressure state as that within the deposition chamber, open the gate 700h to thereby enable the evaporation source within the deposition chamber to be provided with an organic compound. Additionally the organic compound is provided at the evaporation source within the deposition chamber by means of a transfer mechanism.

Additionally, regarding the deposition process within the deposition chamber B708, refer to the explanation of FIG. 2A.

Note that in a similar way to the alignment chamber 705, a cleaning preliminary chamber 722c is coupled to the deposition chamber B708 via a gate (not shown). Additionally its practical arrangement is similar to that of the cleaning preliminary chamber 722a, thus, it is possible by introducing radicals generated in the cleaning preliminary chamber 722c into the deposition chamber B708 to remove organic compounds and the like being internally attached to the deposition chamber B708.

Next, numeral 710 denotes a deposition chamber used for deposition of a third organic compound layer by vacuum evaporation method, which will be called the deposition chamber C710 hereinafter. The deposition chamber C710 is coupled via a gate 700e to the transfer chamber 701. In this embodiment a deposition chamber with the structure shown in FIG. 2A is provided as the deposition chamber C710. With this embodiment, the third organic compound layer capable of emitting blue light is formed at a deposition unit 711 within the deposition chamber C710.

A plurality of evaporation sources are provided with the deposition chamber C710, practically, there are provided a first evaporation source comprising an organic compound with hole injectability, a second evaporation source comprising an organic compound with luminescent ability, a third evaporation source comprising an organic compound with blocking ability, and a fourth evaporation source comprising an organic compound with electron transportability.

Note that sequential vacuum evaporation of these organic compounds makes it possible to form on the anode an organic compound layer consisting essentially of regions having functions of hole injectability, luminescent ability, blocking ability and electron transportability.

Additionally in this embodiment, a mixed region is formed at an interface between different function regions by simultaneous vacuum evaporation of organic compounds forming such both function regions. More specifically, several mixed regions are formed at an interface between the hole injection region and the luminescent region, at an interface between the luminescent region and the blocking region, and at an interface between the blocking region and electron transport region, respectively.

Noted that in the above explanation the organic compound layer is formed by successive vacuum evaporation from four evaporation sources provided with four organic compounds having different functions respectively as the third organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Additionally, as the organic compounds having the plurality of functions and forming the organic compound layer which emits blue light, the ones as indicated in Embodiment 1 is employable, although known materials are freely used in combination where necessary.

It is also noted that the deposition chamber C710 is coupled via a gate 700*i* to a material exchange chamber 716. Also note that the material exchange chamber 715 is provided with a heater for heating organic compounds exchanged. Preheating such organic compounds makes it possible to remove impurities such as water or the like. It will be desirable that a temperature being applied here be 200° C. or below. In addition, since the material exchange chamber 716 is provided with a vacuum pump so that after introducing organic compounds from the outside it is possible to set its interior in a pressure reduction by the vacuum pump. And, when it becomes the same pressure state as that within the deposition chamber, open the gate 700*i* to thereby enable the evaporation sources within the deposition chamber to be provided with organic compounds. Additionally the organic compound is provided at the evaporation source within the deposition chamber by means of a transfer mechanism. Additionally, regarding the deposition process within the deposition chamber C710, refer to the explanation of FIG. 2A.

Note that in a similar way to the alignment chamber 705, a cleaning preliminary chamber 722*d* is coupled to the deposition chamber C710 via a gate (not shown). Additionally its practical arrangement is similar to that of the cleaning preliminary chamber 722*a*, thus, it is possible by introducing radicals generated in the cleaning preliminary chamber 722*d* into the deposition chamber C710 to remove organic compounds and the like being internally attached to the deposition chamber C710.

Next, numeral 712 indicates a deposition chamber for fabricating by vacuum evaporation method a conductive film used as either the anode or cathode of a luminescent element (in this embodiment, a metal film used as the cathode), which chamber will be called the deposition chamber D712. This deposition chamber D712 is coupled via a gate 700*f* to the transfer chamber 701. In this embodiment, at the deposition unit 713 within the deposition chamber D712, an Al—Li alloy film (alloy film of aluminum and lithium) is to be formed as the conductive film used as the cathode of the luminescent element. It will also be possible to perform co-vacuum evaporation of both aluminum and an element belonging to either the group I or group II of the periodic table at a time. The term co-vacuum evaporation refers to a vacuum evaporation method that evaporation sources are heated simultaneously and different materials are mixed together at the deposition step.

It is also noted that the deposition chamber D712 is coupled via a gate 700*j* to a material exchange chamber 717. Also note that the material exchange chamber 717 is provided with a heater for heating organic compounds exchanged. Preheating such organic compounds makes it possible to remove impurities such as water or the like. It will be desirable that a temperature being applied here be 200° C. or below. In addition, since the material exchange chamber 717 is provided with a vacuum pump so that after introducing conductive materials from the outside it is possible to set its interior in a pressure reduction by the vacuum pump. And, when it becomes the same pressure state as that within the deposition chamber, open the gate 700*j* to thereby enable the evaporation sources within the deposition chamber to be provided with conductive materials.

Note that in a similar way to the alignment chamber 705, a cleaning preliminary chamber 722*e* is coupled to the deposition chamber D712 via a gate (not shown). Additionally its practical arrangement is similar to that of the cleaning preliminary chamber 722*a*, thus, it is possible by introducing radicals generated in the cleaning preliminary chamber 722*e* into the deposition chamber D712 to remove conductive materials and the like being internally attached to the deposition chamber D712.

In addition a respective one of the deposition chamber A706, the deposition chamber B708, the deposition chamber C710 and deposition chamber D712 comprises a mechanism for heating the interior of each deposition chamber. Whereby it is possible to remove part of impurities in the deposition chambers.

Further note that although dry pumps, mechanical booster pumps, turbo molecular pumps (magnetic floatation type) or cryopumps are employable as the vacuum pumps provided in these deposition chambers, it is desirable that the cryopumps and dry pumps be used in this embodiment.

In addition, the deposition chamber A706, the deposition chamber B708, the deposition chamber C710 and deposition chamber D712 are reduced in pressure by the vacuum pumps. It is desirable that the finally reached degree of vacuum at this time be greater than or equal to $10^{-6}$ Pa. For example, with the use of a cryopump with its evacuation rate of 10,000 l/s ($H_2O$), a leakage amount within a deposition chamber must be less than or equal to $4.1 \times 10^{-7}$ $Pa*m^3*s^{-1}$ for 20 hours, when the interior of the deposition chamber is formed of aluminum while letting a surface area of the deposition chamber interior measure 10 $m^2$. In order to obtain such vacuum degree, it is effective to minimize by electro-polishing techniques the surface area of the deposition chamber interior.

Next, numeral 718 denotes a sealing chamber (also known as an enclosing chamber or "glove box"), which is coupled via a gate 700*k* to the load chamber 704. In the sealing chamber 718, processing for finally enclosing a luminescent element into a sealed space is performed. This processing is for protection of the formed luminescent element against oxygen and water, which employs a means for mechanically enclosing by cover material or alternatively enclosing by using either thermally hardenable resin or ultraviolet ray hardenable resin material.

While the cover material used may be glass, ceramics, plastic or metal, the cover material must have optical transmissivity in cases where light is emitted toward the cover material side. Additionally the cover material and a substrate with the above-stated luminescent element formed thereon are adhered together by use of a seal material such as thermal hardenable resin or ultraviolet-ray hardenable resin or else, thereby forming an air-tight sealed space by letting the resin be hardened through thermal processing or ultraviolet ray irradiation processing. It is also effective to provide in this sealed space a moisture absorbable material, typical example of which is barium oxide.

It will also be possible to fill the space between the cover material and the substrate having the luminescent element formed thereon with either thermal hardenable resin or ultraviolet-ray hardenable resin. In this case, it is effective to add a moisture absorption material typically such as barium oxide into either the thermal hardenable resin or ultraviolet-ray hardenable resin.

In the deposition apparatus shown in FIG. 7A, a mechanism 719 for irradiation of ultraviolet light to the interior of the sealing chamber 718 (referred to as the "ultraviolet light irradiation mechanism" hereinafter) is provided, which is arranged so that ultraviolet light as emitted from this ultraviolet light irradiation mechanism 719 is used to harden the ultraviolet-ray hardenable resin. Attachment of a vacuum pump makes also possible to reduce pressure within the sealing chamber 718. In case the above sealing process is done mechanically by robot operation, it is possible by performing this process to prevent mixture of oxygen and water because of atmosphere in reduced pressure. Practically it is desired that the concentrations of such oxygen and water be made less than or equal to 0.3 ppm. Additionally it is also possible that the interior of the seal chamber 718 is pressurized adversely. In this case, the sealing chamber 718 is purged by a nitride gas or noble gas of high purity and pressurized, thereby the invasion of oxygen or the like from the outside is prevented.

Next, a delivery chamber (pass box) 720 is coupled to the sealing chamber 718. The delivery chamber 720 is provided with a transfer mechanism B721 for transferring toward the delivery chamber 720 a substrate which sealing of the luminescent element is completed in the sealing chamber 718. The delivery chamber 720 also can be set in a reduced pressure state by attachment of a vacuum pump thereto. This delivery chamber 720 is the facility that prevents the sealing chamber 718 from being exposed directly to the outside air, from which the substrate is removed. Optionally it is also possible to provide a member supply chamber (not shown) for supplying members to be used in the sealing chamber.

It must be noted that although not shown in diagrams of this embodiment, insulating films with lamination of chemical compounds including silicon such as silicon nitride or silicon oxide and with lamination of a diamond like carbon (DLC) film containing carbon on these chemical compounds may be formed on a luminescent element after forming the luminescent element. Additionally the term diamond-like carbon (DLC) film refers to an amorphous film with a mixture of diamond bonding ($sp^3$ bond) and graphite bond ($SP^2$ bond). Note that in this case, a deposition chamber may be provided which comprises a chemical vapor deposition (CVD) apparatus for generating a plasma by application of a self bias to thereby form a thin film through plasma discharge decomposition of material gases.

Note that in the deposition chamber comprising such chemical vapor deposition (CVD) apparatus, there may be used oxygen ($O_2$), hydrogen ($H_2$) methane ($CH_4$), ammonia ($NF_3$) and silane ($SiH_4$). Also note that as the CVD apparatus, there is employable the one that has electrodes of the parallel flat-plate type with RF power supply of 13.56 MHz.

Further, it is also possible to provide a deposition chamber for performing deposition by sputtering methods (also called sputter methods). This is due to the fact that deposition by sputtering is effective in the case of forming the anode after forming organic compound layers on the cathode of a luminescent element. In other words, it is effective in cases where a pixel electrode is the cathode. Additionally the interior of such deposition chamber is set at an atmosphere with oxygen added to argon during deposition whereby the concentration of oxygen in a film thus fabricated is well controlled to enable formation of a low resistance film that is high in optical transmissivity. Also note that it will be desirable that the deposition chamber be shielded by a gate from the transfer chamber in a similar manner to the remaining deposition chambers.

It is to be noted that in the deposition chamber for sputtering, a mechanism may be provided which is operable to control the temperature of such substrate deposited. Additionally it is desirable that the substrate deposited be kept at temperature ranging from 20 to 150° C. Further, although a dry pump, mechanical booster pump, turbo molecular pump (magnetic floatation type) or cryopump is useable as a vacuum pump to be provided in the deposition chamber, the turbo molecular pump (the magnetic flotation type) and dry pump are preferably employed in this embodiment.

As apparent from the foregoing, the use of the deposition apparatus shown in FIGS. 7A and 7B makes it possible to prevent exposure of a luminescent element to the outside air until the luminescent element is completely enclosed in an air-tight sealed space, which in turn enables successful manufacture of a luminescent device with high reliability.

[Embodiment 3]

In this embodiment, a deposition apparatus will be explained with reference to FIGS. 5A and 8B, which is different in substrate transfer method and structure from the deposition apparatus of the inline type as has been indicated in the embodiment 1.

In FIGS. 8A and 8B, a substrate 804 as loaded into a load chamber 800 is transported toward a first alignment unit 801 which is coupled thereto via a gate (not shown). Note that the substrate 804 is subjected to alignment by the method discussed in FIGS. 4A through 4E and then fixed to a holder 802 along with a metal mask 803.

And, the substrate 804 is transferred to a first deposition unit 805 together with the holder 802. Note here that the first alignment unit 801 and the first deposition unit 805 are coupled together via no gates and have the same space. Then, in this embodiment, a rail 812 is provided as a means for enabling free movement between the first alignment unit 801 and the first deposition unit 805, wherein each processing is to be done while the holder 802 is moving along this rail. Additionally the processing position during alignment and deposition is controlled by a control mechanism owned by the holder 802.

And in the first deposition unit 805, different organic compounds is deposited by vacuum evaporation from a plurality of evaporation sources 806 furnished with the organic compounds respectively to thereby form a first organic compound layer. Note that this movement means will also be used in the case of transfer toward a second alignment unit 807 and a second deposition unit 808 for fabrication of a second organic compound layer in a similar way to that discussed above.

Further, in the case of forming a third organic compound also, it is similarly transferred to a third alignment unit 809 and a third deposition unit 810.

As discussed above in this embodiment, it is possible to form three different kinds of organic compound layers within the same space. The third deposition unit 810 is coupled via a gate (not shown) to an unload chamber 811, thus enabling unloading of a substrate with deposition completed.

It is noted that the processing method at the alignment units and the deposition units in this embodiment is similar to that in the alignment and the deposition chambers of the embodiment 1.

It is also noted that in this embodiment, provision of a partition wall between the alignment units and the deposition units makes it possible to prevent organic compounds from dispersing out of the evaporation sources during deposition toward locations other than the deposition units.

In the deposition apparatus of this embodiment also, a cleaning preliminary chamber 813 may be provided for cleaning of the interior of each deposition chamber and metal masks.

Forming a plurality of organic compound layers are formed within the same space by using the deposition apparatus stated above, movement between different organic compound layers during formation, thus making it possible to shorten a time as taken to complete the processing.

Note here that while in the deposition apparatus indicated in this embodiment it is possible to form three kinds of organic compound layers having a plurality functions on a substrate with the anode or cathode of a luminescent through continuous vacuum evaporation processes in the deposition chamber. It is modifiable that a further deposition chamber for fabrication of a conductive film is provided for enabling continuous formation of the cathode or anode of such luminescent element. Additionally in the case of forming the cathode, the conductive film may be an Al—Li alloy film (alloy film of aluminum and lithium) or alternatively a film obtained by co-vacuum evaporation of both aluminum and an element belonging to either the group I or group II of the periodic table at a time, in the case of forming the anode, there may be used indium oxide, tin oxide, zinc oxide, or an alloys of them (such as ITO).

In addition to the above, it is also possible to provide a processing chamber for performing a sealing of the luminescent element thus manufactured.

[Embodiment 4]

Figure 9:
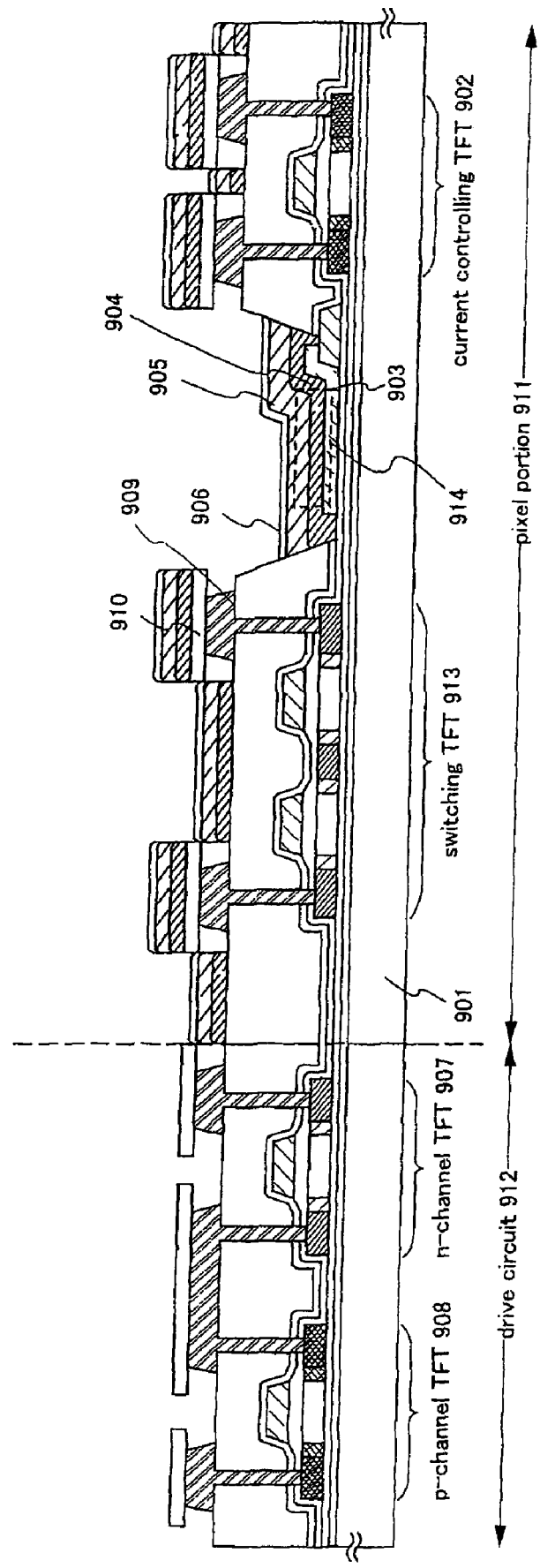
FIG. 9 is a diagram explaining on a luminescent device.

In this embodiment an explanation will be given of a luminescent device manufactured by use of the deposition apparatus of the present invention. FIG. 9 is a diagram showing a cross-sectional view of an active matrix type luminescent device, Note that although thin film transistors (referred to as "TFTs" hereinafter) are employed as active elements, these are replaceable by MOS transistors.

Additionally, although top gate type TFTs (practically planar type TFTs) will be exemplarily indicated as the TFTs, bottom gate type TFTs (typically, inverse stagger type TFTs) is alternatively employable.

In FIG. 9, numeral 901 denotes a substrate, here, which permits transmission of visible light rays. Practically, a glass substrate, a quartz substrate, a crystallized glass substrate or plastic substrate (including a plastic film) are useable. Note that the substrate 901 includes an insulating film provided on the surface thereof.

A pixel portion 911 and a drive circuit 912 are provided on the substrate 901. The pixel portion 911 will first be explained below.

The pixel portion 911 is a region that performs image displaying. A plurality of pixels are present on the substrate, each of which is provided with a TFT 902 for control of a current flowing in a luminescent element (referred to hereinafter as current controlling TFT), a pixel electrode (anode) 903, an organic compound layer 904 and a cathode 905. In addition, numeral 913 denotes a TFT for controlling a voltage applied to the gate of the current controlling TFT (referred to as switching TFT hereinafter).

Preferably here, the current controlling TFT 902 is a p-channel type TFT. Although it may alternatively be an n-channel TFT, the use of p-channel TFT makes it possible to suppress consumption of electrical power in case the current controlling TFT is connected to the anode of the luminescent element as shown in FIG. 9. Note however that the switching TFT 913 may be either n-channel TFT or p-channel TFT.

It is noted that drain of the current controlling TFT 902 is electrically connected with the pixel electrode 903. In this embodiment, since the pixel electrode 903 is used a conductive material with its work function within a range of 4.5 to 5.5 eV, the pixel electrode 903 functions as the anode of the luminescent element. The pixel electrode 903 may typically be made of indium oxide, tin oxide, zinc oxide, or compounds thereof (such as ITO). The organic compound layer 904 is provided on the pixel electrode 903.

Further, the cathode 905 is provided on the organic compound layer 904. It is desirable that the cathode 905 be made of a conductive material with its work function ranging from 2.5 to 3.5 eV. The cathode 905 is typically made from a conductive film containing alkaline metal elements or alkali rare metal elements, a conductive film containing aluminum, and one that aluminum or silver is laminated on the above conductive films.

In addition the luminescent element 914 comprising the pixel electrode 903, the organic compound layer 904, and cathode 905 is covered with a protective film 906. This protective film 906 is provided for protection of the luminescent element 914 against oxygen and water. The protective film 906 is made of material such as silicon nitride, silicon oxynitride, aluminum oxide, tantalum oxide or carbon (typically, diamond like carbon).

An explanation will next be given of the drive circuit 912. The drive circuit 912 is the region that controls the timing of signals (gate signal and data signal) being sent to the pixel portion 911, which is provided with a shift register, a buffer, a latch, an analog switch (transfer gate), or a level shifter. In FIG. 9 a CMOS circuit is shown which is made up of an n-channel TFT 907 and p-channel TFT 908 for use as a basic unit of these circuits.

The circuit structure of the shift register, the buffer, the latch, the analog switch (transfer gate) or the level shifter may be designed in a known way. Additionally although in FIG. 9 the pixel portion 911 and the drive circuit 912 are provided on the same substrate, it is also possible to electrically connect IC and LSI without providing the drive circuit 912.

Additionally, although in FIG. 9 the pixel electrode (anode) 903 is electrically connected to the current controlling TFT 902, this may be modified into a structure with the cathode connected to the current controlling TFT. In such case, the pixel electrode 903 may be made of the same material as that of the cathode 90S while letting the cathode be made of similar material to that of the pixel electrode (anode) 903. In such case it will be preferable that the current controlling TFT be an n-channel TFT.

It is also noted that in this embodiment, a shape with an eave (called the eave structure hereinafter) consisting essentially of a wiring line 909 and a separation portion 910 is provided. The eave structure made of the wiring line 909 and the separation portion 910 shown in FIG. 9 is manufacturable by a method having the steps of laminating a metal constituting the wiring line 909 and a material (e.g. metal nitrides) that forms the separation portion 910 and has a lower etch rate than the metal and then of etching the same. With use of this shape, it is possible to prevent the pixel electrode 903 and the wiring line 909 from electrically shorting with the cathode 905.

Additionally in this embodiment, unlike standard active matrix type luminescent devices, the cathode 905 on a pixel is formed into a stripe shape (in a similar manner to that of the cathode of a passive matrix).

Figure 10A:
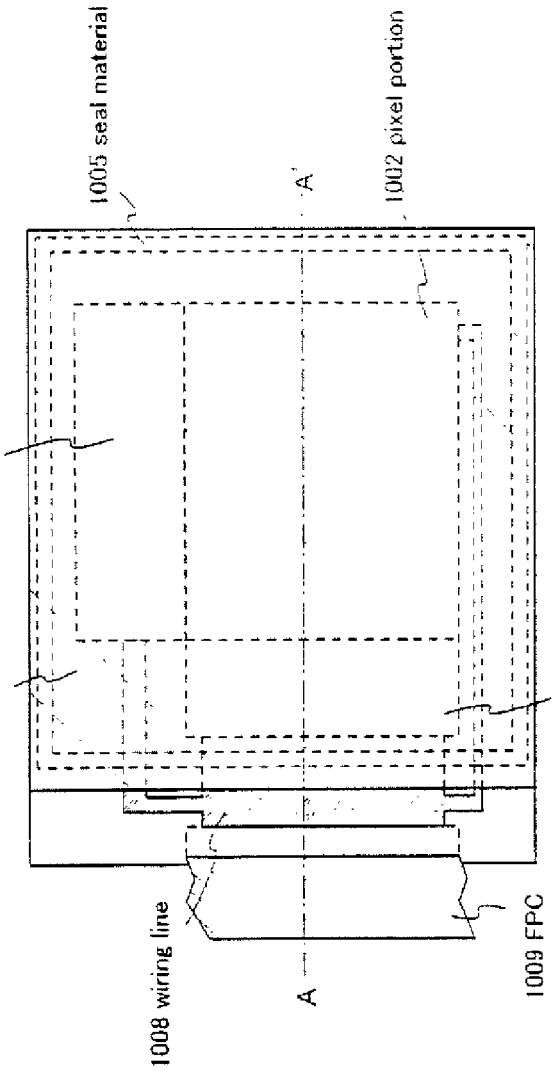
FIGS. 10A and 10B are diagrams explaining on a seal structure.
Figure 10B:
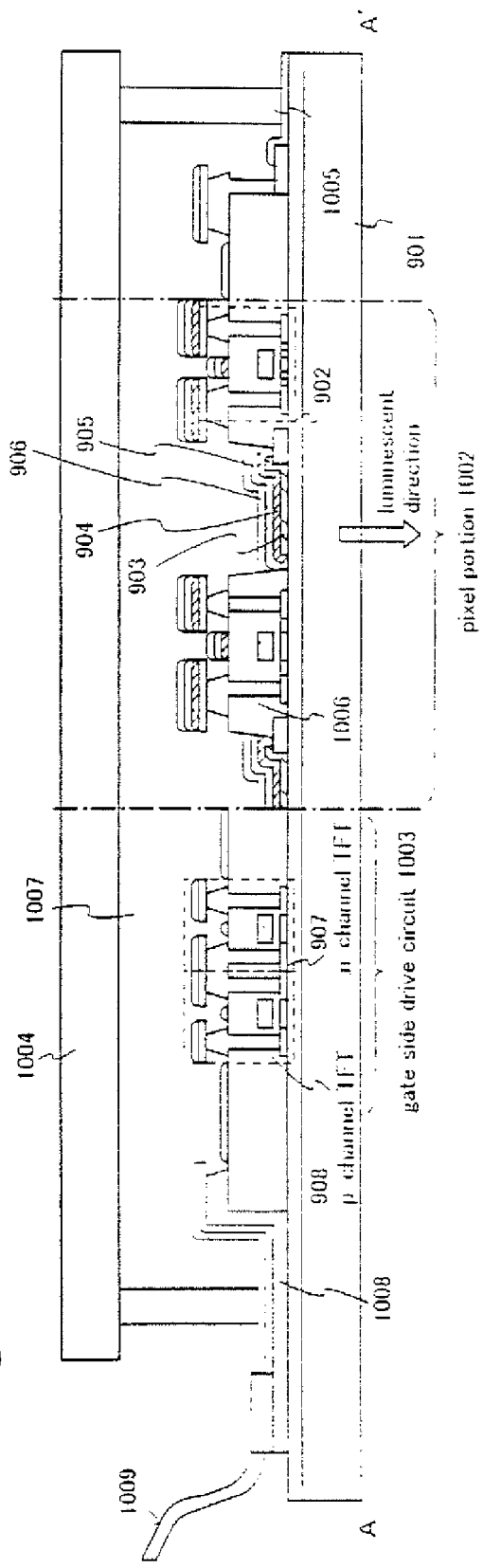

Here, an appearance of the active matrix type luminescent device of FIG. 9 is shown in FIGS. 10A and 10B. Note here that an upper plan view is shown in FIG. 10A whereas a sectional view taken along line A-A' of FIG. 10A is shown in FIG. 10B. Additionally the reference numerals used in FIG. 9 are also used here.

Numeral 1001 indicated by dotted lines denotes a source side drive circuit; 1002 denotes a pixel portion; 1003 is a gate side drive circuit. In addition, 1004 indicates a cover material, and 1005 is a seal material, wherein a space 1007 is provided in interior part surrounded by the seal material 1005.

Additionally, numeral 1008 denotes a wiring line which transfers signal as input to the source side drive circuit 1001 and gate side drive circuit 1003, which receives a video signal and a clock signal from a flexible printed circuit (FPC) 1009 for use as an external input terminal. Note that although the FPC alone is depicted herein, a printed wiring board (PWB) is attachable to this FPC. The luminescent device of the subject patent application includes an IC-mounted luminescent module as well as a luminescent module with either the FPC or the PWB attached onto a luminescent panel.

An explanation will next be given of the sectional structure with reference to FIG. 10B. The pixel portion 1002 and the gate side drive circuit 1003 are formed at upper part of the substrate 901, wherein the pixel portion 1002 is formed of a plurality of pixels each including the current controlling TFT 902 and the pixel electrode 903 electrically connected to the drain of the current controlling TFT. Additionally the gate side drive circuit 1003 is formed using a CMOS circuit with a combination of the n-channel TFT 907 and the p-channel TFT 908.

The pixel electrode 903 functions as the anode of a luminescent element. In addition an interlayer insulating film 1006 is formed at the opposite ends of the pixel electrode 903, and the organic compound layer 904 and the cathode 905 of the luminescent element are formed on the pixel electrode 903.

The cathode 905 also serves as a common wiring line for a plurality of pixels and is electrically connected via the connection lead 1008 with the FPC 1009. Further all the elements involved in the pixel portion 1002 and the gate side drive circuit 1003 are covered with the protective film 906.

Note that the cover material 1004 is adhered by the seal material 1005. Additionally a spacer formed of a resin film may be provided in order to retain a distance between the cover material 1004 and the luminescent element. And an interior of the seal material 1005 becomes a sealed space, in which a inactive gas such as nitrogen or argon or else is filled. Optionally it is also be effective to provide in this sealed space a moisture absorption material such as barium oxide.

Note that while a glass, a ceramics, a plastic or metals are usable as the cover material, it must be optical transmissivity in the case of irradiating light onto the cover material side. Additionally fiberglass-reinforced plastics (FRP), polyvinylfluoride (PVF), Mylar, polyester or acryl is useable as the plastic material.

The luminescent element 914 formed on the substrate is sealed by using the cover material 1004 and the seal material 1005 and thus it is possible to completely shield it from the outside and prevent invasion of material which accelerates degradation of organic compound layers due to oxidation such as water and oxygen. Thus it is possible to obtain the luminescent device with high reliability.

Another luminescent device different in structure from the one discussed in FIG. 9 will be explained with reference to FIG. 15. Arrangements of a switching TFT 1513 and a current controlling TFT 1502 in a pixel portion 1511 and arrangements of a p-channel TFT 1508 and an n-channel TFT 1507 in a driver circuit 1512 are similar to those in FIG. 9. A method of forming a luminescent element 1514 comprising an anode 1503, an organic compound layer 1504, and a cathode 1505 is different from that shown in FIG. 9.

Figure 15:
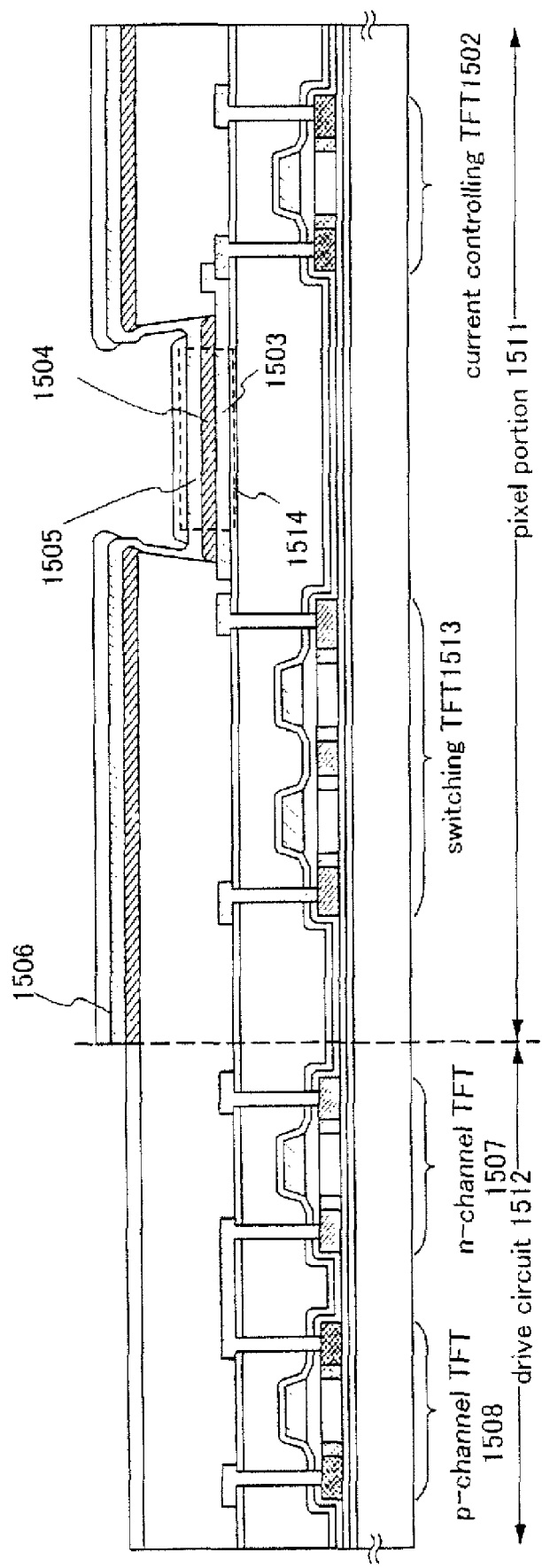
FIG. 15 is a diagram explaining on a luminescent device.

Although in FIG. 9 vacuum evaporation method is used for formation of the luminescent element, in this embodiment a structure shown in FIG. 15 is formed by employing a method that an ionized organic compound is vacuum evaporated (ion-plating method). Note that this structure is desirable because of its capability to permit reflection of light emitted. Additionally the luminescent element 1514 is coated with a protective film 1506 formed of an insulating film containing silicon.

Note that the luminescent device in this embodiment is capable of deposition using the deposition apparatus explained in the embodiments 1 to 3.

[Embodiment 5]

Figure 11:
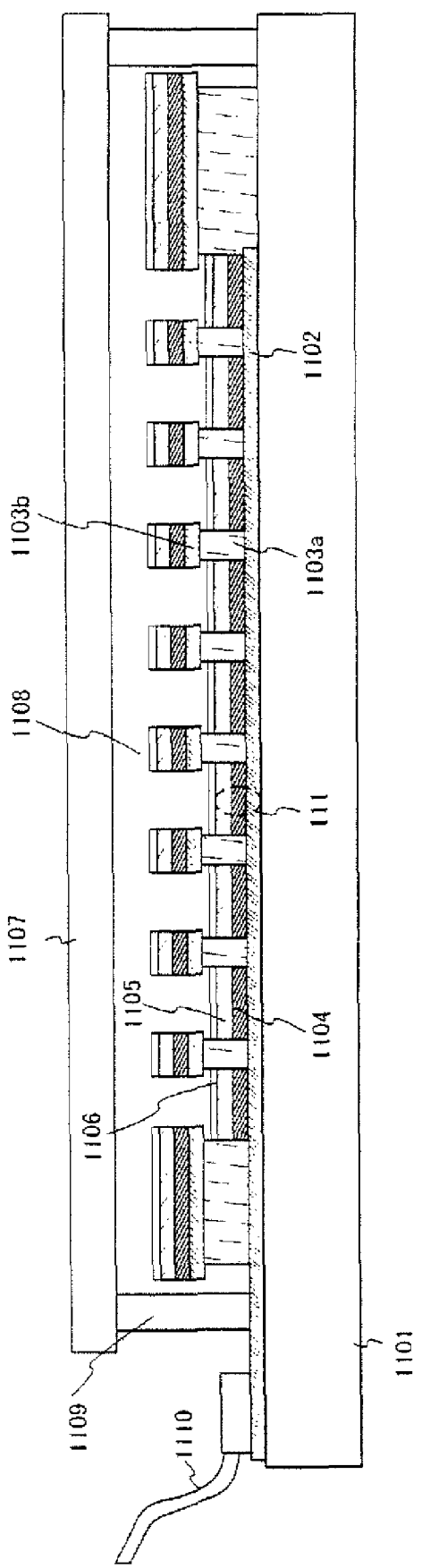
FIG. 11 is a diagram explaining on a luminescent device.

In this embodiment an explanation is given of a luminescent device of the passive type (simple matrix type) which is manufactured by the deposition apparatus of the present invention with reference to FIG. 11. In FIG. 11, numeral 1101 denotes a glass substrate whereas 1102 denotes an anode formed of a transparent conductive film. In this embodiment a chemical compound comprising indium oxide and zinc oxide is formed by vacuum evaporation as the transparent conductive film. Note that although not shown in FIG. 11, a plurality of anodes are laid out in a direction parallel to the surface of drawing paper sheet.

In addition, cathode partition walls (1103a, 1103b) are formed so that these intersect the anodes 1102 laid out into a stripe shape. The cathode partition walls (1103a, 1103b) are formed in a vertical direction to the surface of the drawing sheet.

Next, an organic compound layer 1104 is formed. The organic compound layer 1104 thus formed here preferably has a plurality of function regions by combination a plurality of organic compounds each of which has function of the hole injectability, hole transportability, luminescent ability, blocking ability, electron transportability or electron injectability.

Note that in this embodiment also, a mixed region is formed between adjacent function regions. Additionally the mixed region is formed by using the method indicated in the embodiments stated supra.

Also note that these organic compound layers 1104 are formed along grooves defined by the cathode partition walls (1103a, 1103b) and thus are laid out into a stripe shape in the vertical direction to the surface of the drawing sheet.

Thereafter, a plurality of cathodes 1105 are laid out into a stripe shape in such a manner that these cross the anodes 1102 with the vertical direction to the surface of the drawing sheet becoming the longitudinal direction thereof. Additionally in this embodiment, the cathodes 1105 are made of MgAg and fabricated by vacuum evaporation. In addition, although not specifically depicted herein, the cathodes 1105 are designed so that a wiring lines are extended to reach portions to which an FPC is attached, thereby enabling application of a given voltage. Further, after forming the cathodes 1105, a silicon nitride film is provided as a protective film 1106.

Through the processes above, a luminescent element 1111 is formed on the substrate 1101. Note here that in this embodiment, lower side electrodes are the anodes 1102 with optical transmittance so that light produced at an organic compound layer emits onto a lower surface (substrate 1101 side). However, it is also possible that the structure of the luminescent element 1111 is reversed to thereby let the lower side electrodes be cathodes with optical shieldability. In such case, light produced at the organic compound layer 1104 is emitted to an upper surface (opposite side to substrate 1101).

Next, prepare a ceramics substrate for use as a cover material 1107. With the structure of this embodiment, though the ceramics substrate is used due to its superiority of light shielding performance, obviously, in case the structure that the luminescent element 1111 is reversed in the way described previously, a substrate made of plastic or glass may be used in view of the fact that the cover material 1107 is better in light transmittance.

The cover material 1107 thus prepared is then adhered by a sealing material 1109 made of ultraviolet ray hardenable resin. Note that an interior 1108 of the seal material 1109 becomes an air-tight closed space, which is filled with an inactive gas such as nitrogen or argon. Optionally it will also be effective to provide in this sealed space 1108 a moisture absorption material such as barium oxide. Lastly attach an anisotropic conductive film (FPC) 1110, thus completing the passive type luminescent device.

It should be noted that the luminescent device as indicated in this embodiment is manufacturable by use of any one of the deposition apparatuses indicated in the embodiments 1 to 3.

[Embodiment 6]

Being self-luminous, a luminescent device using a luminescent element has better visibility in bright places and wider viewing angle than liquid crystal display devices. Therefore various electric appliances can be completed by using the luminescent device of the present invention.

Given as examples of an electric appliance that employs a luminescent device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the luminescent device using the luminescent element. Specific examples of these electric appliance are shown in FIGS. 12A to 12H.

Figure 12A:
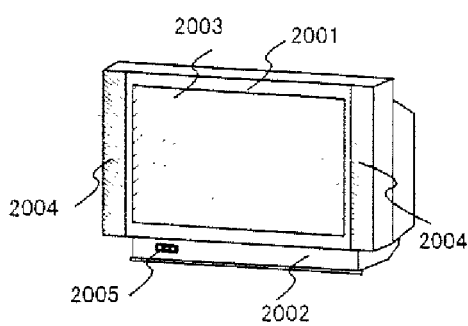
FIGS. 12A through 12H are diagrams showing examples of electrical instruments.

FIG. 12A shows a display device, which is composed of a case 2001, a support base 2002, a display unit 2003, speaker units 2004, a video input terminal 2005, etc. The luminescent device manufactured in accordance with the present invention can be applied to the display unit 2003. Since the luminescent device having the luminescent element is self-luminous, the device does not need back light and can make a thinner display unit than liquid crystal display devices. The display device refers to all display devices for displaying information, including ones for personal computers, for TV broadcasting reception, and for advertisement.

Figure 12B:
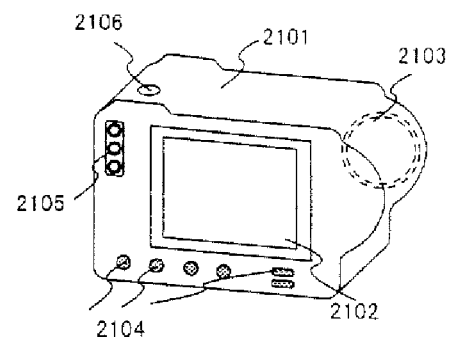

FIG. 12B shows a digital still camera, which is composed of a main body 2101, a display unit 2102, an image receiving unit 2103, operation keys 2104, an external connection port 2105, a shutter 2106, etc. The luminescent device manufactured in accordance with the present invention can be applied to the display unit 2102.

Figure 12C:
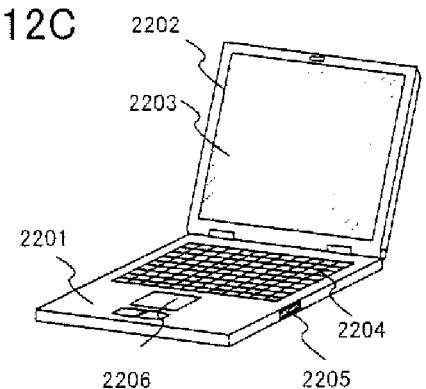

FIG. 12C shows a notebook personal computer, which is composed of a main body 2201, a case 2202, a display unit 2203, a keyboard 2204, an external connection port 2205, a pointing mouse 2206, etc. The luminescent device manufactured in accordance with the present invention can be applied to the display unit 2203.

Figure 12D:
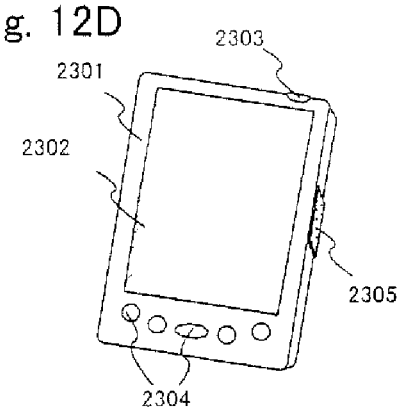

FIG. 12D shows a mobile computer, which is composed of a main body 2301, a display unit 2302, a switch 2303, operation keys 2304, an infrared port 2305, etc. The luminescent device manufactured in accordance with the present invention can be applied to the display unit 2302.

Figure 12E:
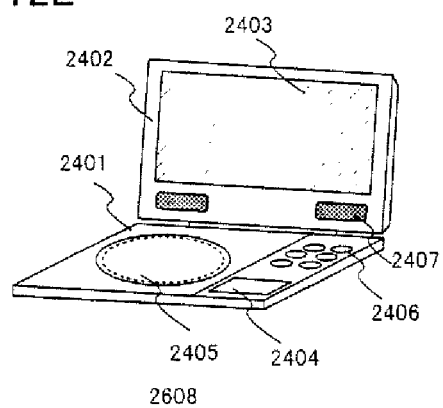

FIG. 12E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The luminescent device manufactured in accordance with the present invention can be applied to the display units A 2403 and B 2404. The image reproducing device equipped with a recording medium also includes home-video game machines.

Figure 12F:
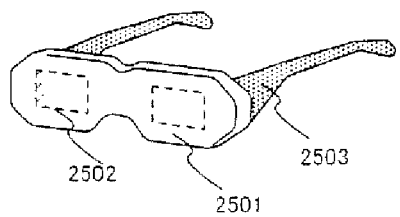

FIG. 12F shows a goggle type display (head mounted display), which is composed of a main body 2501, display units 2502, and arm units 2503. The luminescent device manufactured in accordance with the present invention can be applied to the display units 2502.

Figure 12G:
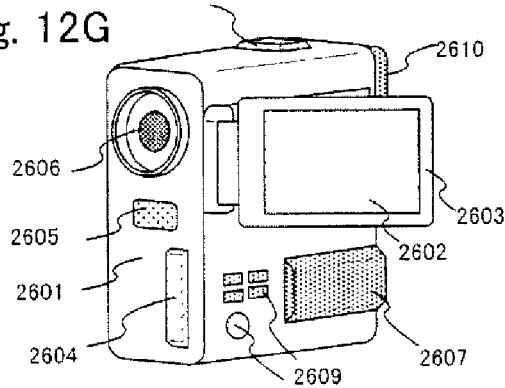

FIG. 12G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The luminescent device manufactured in accordance with the present invention can be applied to the display unit 2602.

Figure 12H:
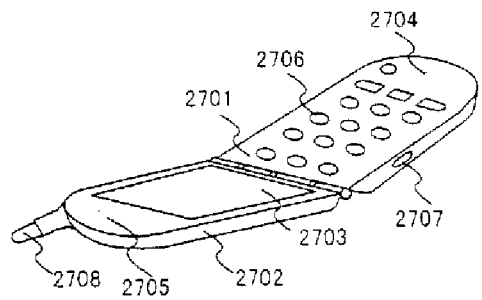

FIG. 12H shows a cellular phone, which is composed of a main body 2701, a case 2702, a display unit 2703, an audio input unit 2704, an audio output unit 2705, operation keys 2706, an external connection port 2707, an antenna 2708, etc. The luminescent device manufactured in accordance with the present invention can be applied to the display unit 2703. If the display unit 2703 displays white letters on black background, the cellular phone consumes less power.

If the luminance of light emitted from organic materials is raised in future, the luminescent device can be used in front or rear projectors by enlarging light that contains outputted image information through a lens or the like and projecting the light.

These electric appliances now display with increasing frequency information sent through electronic communication lines such as the Internet and CATV (cable television), especially, animation information. Since organic materials have very fast response speed, the luminescent device is suitable for animation display.

In the luminescent device, luminescent portions consume power and therefore it is preferable to display information in a manner that requires less luminescent portions. When using the luminescent device in display units of portable information terminals, particularly cellular phones and audio reproducing devices that mainly display text information, it is preferable to drive the device such that non luminescent portions form a background and luminescent portions form text information.

As described above, the application range of the luminescent device manufactured by using the deposition device of the present invention is so wide that it is applicable to electric appliances of any field. The electric appliances of this embodiment can employ as their display units any luminescent device shown in Embodiments 4 or 5, which is formed by the deposition apparatus shown in Embodiments 1 to 3.

[Embodiment 7]

In this embodiment, the pixel portion structure of the luminescent device formed by a deposition apparatus of the present invention is described.

Figure 16A:
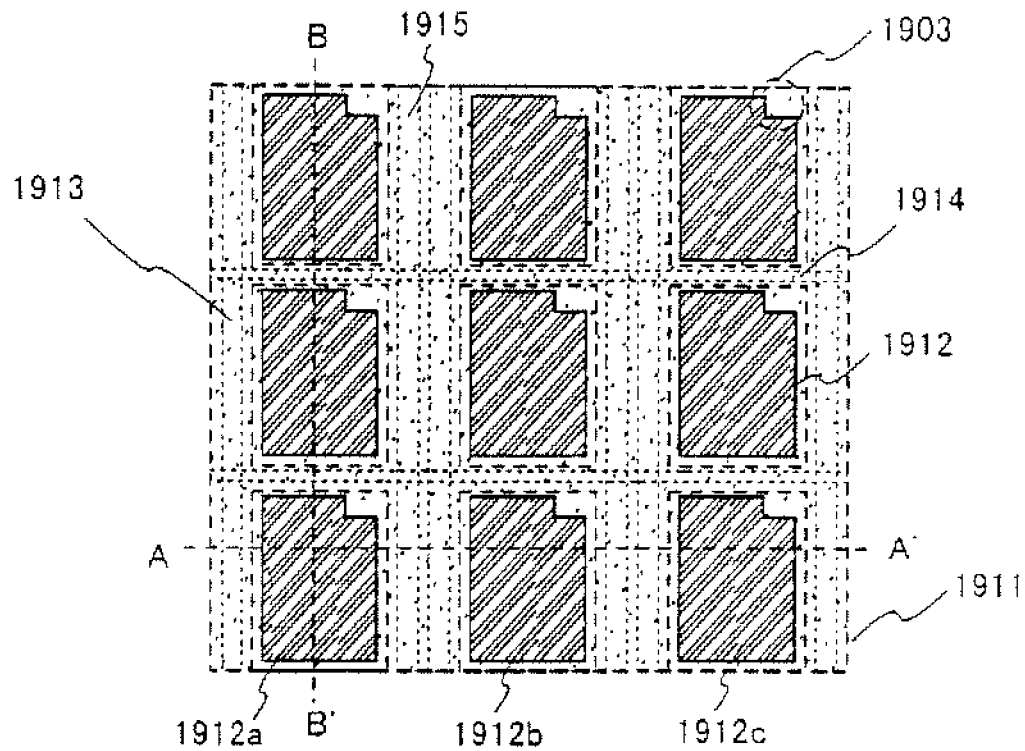
FIGS. 16A through 16C are diagrams explaining on a pixel portion.

A part of the top surface view of a pixel portion 1911 is shown in FIG. 16A. The plural pixels 1912a to 1912c are formed in the pixel portion 1911. The top surface view shows the state of an insulating layer 1902 formed to cover the edge portion of the pixel electrode formed in a pixel. Thus, the insulating layer 1902 is formed to cover a source line 1913, a scanning line 1914 and a current supply line 1915. The insulating layer 1902 also covers the region a (1903) where connection portion between the pixel electrode and the TFT is formed at the bottom thereof.

Figure 16B:
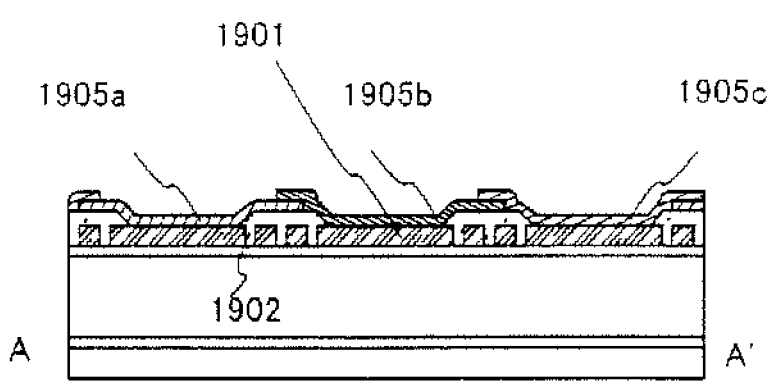

In addition, FIG. 16B shows a cross-section view taken along the dot line A-A' of the pixel portion 1911 shown in FIG. 16A and the state of forming organic compound layers 1905a to 19105c on the pixel electrode 1901. Further, the organic compound layer composed by same material is formed in the vertical direction to the drawing sheet, and the organic compound layer composed by different material is formed in the horizontal direction to the drawing sheet.

For example, the organic compound layer (R) 1905a emitted red light is formed in the pixel (R) 1912a, the organic compound layer (G) 1905b emitted green light is formed in the pixel (G) 1912b and the organic compound layer (B) 1905c emitted blue light is formed in the pixel (B) 1912c. The insulating film 1902 becomes a margin when the organic compound layer is formed. There is no problem if it is on the insulating film 1902 even if the deposition position of the organic compound layer shifts somewhat, and the organic compound layer composed by different material comes in succession on the insulating film 1902 as shown in FIG. 16B.

Figure 16C:
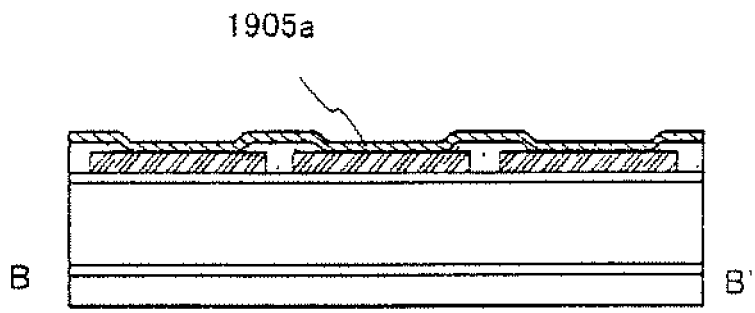
Figure 17:
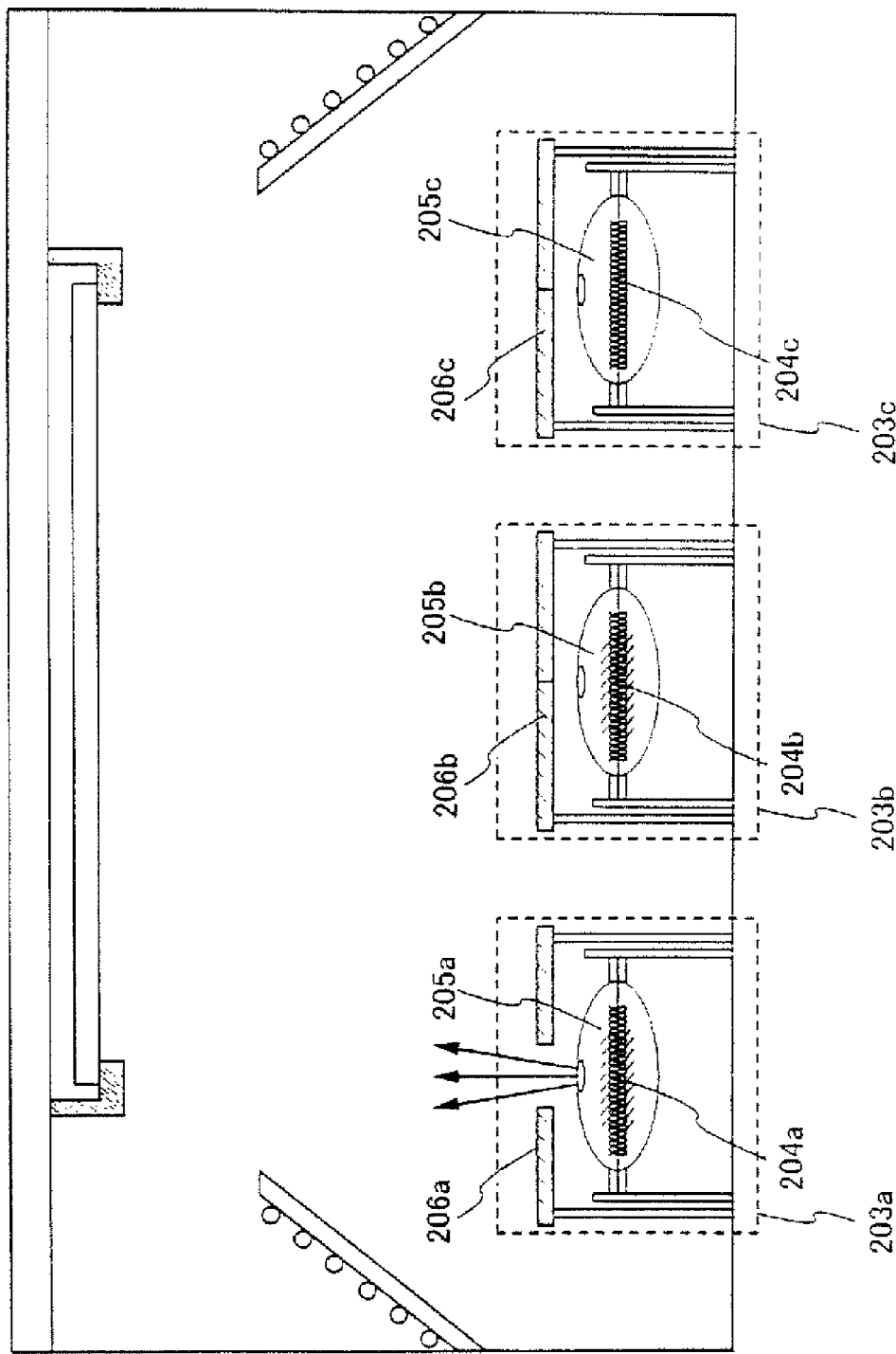
FIG. 17 is a diagram explaining on material chambers.

In addition, FIG. 16C shows a cross-section view taken along the dot line B-B' of the pixel portion 1911 shown in FIG. 16A and the state of forming the organic compound layer 1905 on the pixel electrode 1901 same as FIG. 16B.

The pixel taken along the dot line B-B' have a structure shown in FIG. 16C, because the organic compound layer (R) 1905a emitted red light same as the pixel (R) 1912a is formed in above-mentioned pixel.

Therefore, the organic compound layer (R) 1905a emitted red light, the organic compound layer (G) 1905b emitted green light and the organic compound layer (B) 1905c emitted blue light are formed in the pixel portion 1911. Thus, the full-color of the luminescent device can be realized.

As has been described above, fabricating organic compound layers of the luminescent element by use of the deposition apparatus of the present invention makes it possible to continuously form the organic compound layers each having a plurality of function regions, which in turn enables preclusion of contamination of impurities at the interface of adjacent ones of such function regions. Furthermore, it is also possible to form between the function regions a mixed region consisting essentially of the organic compounds that form respective function regions, thereby enabling relaxation of energy barrier between organic layers at the function region interface. This in turn makes it possible to improve the carrier injectability between the organic layers, thus enabling formation of the organic luminescent elements capable of reducing drive voltages while at the same time offering longer lifetime thereof.

What is claimed is:
1. A light-emitting device comprising:
a transistor over a substrate;
an insulating film over the transistor, wherein the insulating film includes a first opening and a second opening;
a wiring over the insulating film, wherein the wiring is electrically connected to the transistor through the first opening;
a separation portion over the wiring; and
a light-emitting element provided in the second opening, wherein the light-emitting element includes a first electrode, a second electrode, and an organic compound layer provided between the first electrode and the second electrode,
wherein an edge of the organic compound layer corresponds to an edge of the separation portion, and
wherein the separation portion disconnects organic compound layer material in the light-emitting element from organic compound layer material on top of the separation portion.
2. A light-emitting device according to claim 1, wherein the separation portion includes metal nitride.

3. A light-emitting device according to claim 1, wherein a material of the separation portion has a lower etch rate than a material of the wiring.
4. A light-emitting device comprising:
a transistor over a substrate;
an insulating film over the transistor, wherein the insulating film includes a first opening and a second opening;
a wiring over the insulating film, wherein the wiring is electrically connected to the transistor through the first opening;
a separation portion over the wiring; and
a light-emitting element provided in the second opening, wherein the light-emitting element includes a first electrode, a second electrode, and an organic compound layer provided between the first electrode and the second electrode,
wherein the organic compound layer includes a first function region, a mixed region over the first function region, and a second function region over the mixed region,
wherein an edge of the organic compound layer corresponds to an edge of the separation portion, and
wherein the separation portion disconnects organic compound layer material in the light-emitting element from organic compound layer material on top of the separation portion.
5. A light-emitting device according to claim 4, wherein the separation portion includes metal nitride.
6. A light-emitting device according to claim 4, wherein a material of the separation portion has a lower etch rate than a material of the wiring.
7. A light-emitting device according to claim 4, wherein the first function region includes a first organic compound, the mixed region includes the first organic compound and a second organic compound, and the second function region includes the second organic compound.
8. A light-emitting device according to claim 4, further comprising a second mixed region over the second function region, and a third function region over the second mixed region.
9. A light-emitting device according to claim 4, further comprising a second mixed region over the second function region, and a third function region over the second mixed region, and
wherein the first function region includes a first organic compound, the mixed region includes the first organic compound and a second organic compound, the second function region includes the second organic compound, the second mixed region includes the second organic compound and a third organic compound, and the third function region includes the third organic compound.
10. A light-emitting device according to claim 4, further comprising a second mixed region over the second function region, and a third function region over the second mixed region, and
wherein the first function region includes a first organic compound, the mixed region includes the first organic compound and a second organic compound, the second function region includes the second organic compound, the second mixed region includes the second organic compound and a third organic compound, and the third function region includes the second organic compound.
11. A light-emitting device comprising:
a transistor over a substrate;
a first insulating film over the transistor, wherein the first insulating film includes a first opening;

a wiring over the first insulating film, wherein the wiring is electrically connected to the transistor through the first opening;

a second insulating film over the wiring and overlapping with the transistor, wherein the second insulating film includes a second opening, and a light-emitting element provided in the second opening, wherein the light-emitting element includes a first electrode, a second electrode, and an organic compound layer provided between the first electrode and the second electrode, wherein the organic compound layer includes a first function region, a second function region, and a mixed region provided between the first function region and the second function region, wherein an edge of the organic compound layer corresponds to an edge of the second insulating film, and wherein the second insulating film disconnects organic compound layer material in the second opening from organic compound layer material on top of the second insulating film.

12. A light-emitting device according to claim 11, further comprising a second mixed region over the second function region, and a third function region over the second mixed region.

13. A light-emitting device according to claim 11, wherein the first function region includes a first organic compound, the mixed region includes the first organic compound and a second organic compound, and the second function region includes the second organic compound.

14. A light-emitting device according to claim 11, further comprising a second mixed region over the second function region, and a third function region over the second mixed region, and wherein the first function region includes a first organic compound, the mixed region includes the first organic compound and a second organic compound, the second function region includes the second organic compound, the second mixed region includes the second organic compound and a third organic compound, and the third function region includes the third organic compound.

15. A light-emitting device according to claim 11, further comprising a second mixed region over the second function region, and a third function region over the second mixed region, and wherein the first function region includes a first organic compound, the mixed region includes the first organic compound and a second organic compound, the second function region includes the second organic compound, the second mixed region includes the second organic compound and a third organic compound, and the third function region includes the second organic compound.

* * * * *